United States Patent
Moedl et al.

(10) Patent No.: US 9,612,266 B2
(45) Date of Patent: Apr. 4, 2017

(54) CAPACITY MEASURING CIRCUIT, SENSOR SYSTEM AND METHOD FOR MEASURING A CAPACITY USING A SINUSOIDAL VOLTAGE SIGNAL

(71) Applicant: Fraunhofer-Gesellschaft zur Foerderung der angewandten Forschung e.V., Munich (DE)

(72) Inventors: Stefan Moedl, Hilpolstein (DE); Johann Hauer, Erlangen (DE); Josef Sauerer, Herzogenaurach (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 775 days.

(21) Appl. No.: 13/762,695

(22) Filed: Feb. 8, 2013

(65) Prior Publication Data

US 2013/0147496 A1    Jun. 13, 2013

Related U.S. Application Data

(63) Continuation of application No. PCT/EP2011/063568, filed on Aug. 5, 2011.

(30) Foreign Application Priority Data

Aug. 12, 2010    (DE) .................. 10 2010 039 272

(51) Int. Cl.
G01R 27/26    (2006.01)
G01D 5/24    (2006.01)
H03M 3/00    (2006.01)

(52) U.S. Cl.
CPC ........... G01R 27/2605 (2013.01); G01D 5/24 (2013.01); H03M 3/456 (2013.01); H03M 3/43 (2013.01)

(58) Field of Classification Search
None
See application file for complete search history.

(56) References Cited

U.S. PATENT DOCUMENTS 4,295,105 A * 10/1981 Bingham .................. H03D 7/00
332/149
4,458,216 A * 7/1984 Bingham .................. H03C 1/00
332/151

(Continued)

FOREIGN PATENT DOCUMENTS

DE    102005038875    11/2006
JP    H11132787 A    5/1999

(Continued)

OTHER PUBLICATIONS

Dong, Y et al., "Force Feedback Linearization for Higher-Order Electromechanical Sigma-Delta Modulators", Journal of Micromechanics and Microengineering. Institute of Physics Publishing. vol. 16. IOP Publishing Ltd., 2006, 54-60.

(Continued)

*Primary Examiner* — Paresh Patel
(74) *Attorney, Agent, or Firm* — Michael A. Glenn; Perkins Coie LLP

(57) ABSTRACT

A capacity measuring circuit includes a measuring voltage source configured to feed a sinusoidal voltage signal to a first terminal of a capacity to be measured so as to cause a temporal change in a charge stored on the capacity to be measured. The capacity measuring circuit additionally includes a delta-sigma modulator. The delta-sigma modulator is configured to receive a charge from a second terminal of the capacity to be measured and to provide a digital output signal which is dependent on a quantity of the charge received from the capacity to be measured. The capacity measuring circuit may be employed in a sensor system.

22 Claims, 13 Drawing Sheets

(56) References Cited

U.S. PATENT DOCUMENTS

| | | | | |
|---|---|---|---|---|
| 4,492,935 A | * | 1/1985 | Fleischer | H03B 5/06 |
| | | | | 331/135 |
| 5,734,683 A | * | 3/1998 | Hulkko | H03D 3/008 |
| | | | | 375/247 |
| 6,452,521 B1 | | 9/2002 | Wang et al. | |
| 6,970,126 B1 | * | 11/2005 | O'Dowd | H03M 3/34 |
| | | | | 341/143 |
| 7,141,759 B2 | * | 11/2006 | Mela | B23K 9/1056 |
| | | | | 219/130.21 |
| 7,423,568 B2 | * | 9/2008 | Hellwig | G01D 5/24 |
| | | | | 341/143 |
| 8,054,089 B2 | | 11/2011 | Hauer et al. | |
| 2010/0013688 A1 | | 1/2010 | Murakami et al. | |

FOREIGN PATENT DOCUMENTS

| | | | |
|---|---|---|---|
| JP | 2008542696 A | 11/2008 | |
| JP | 2009524997 A | 7/2009 | |
| JP | 2011107086 A | 6/2011 | |
| WO | WO-2006098976 | 9/2006 | |
| WO | 2006125639 A1 | 11/2006 | |
| WO | 2007089640 A2 | 8/2007 | |
| WO | 2010036545 A2 | 4/2010 | |

OTHER PUBLICATIONS

Zhang, C et al., "A Large Dynamic Range CMOS Readout Circuit for MEMS Vibratory Gyroscope", IEEE Sensors 2008 Conference., 2008, 1123-1126.

* cited by examiner

CAPACITY MEASURING CIRCUIT, SENSOR SYSTEM AND METHOD FOR MEASURING A CAPACITY USING A SINUSOIDAL VOLTAGE SIGNAL

CROSS-REFERENCE TO RELATED APPLICATIONS

This application is a continuation of copending International Application No. PCT/EP2011/063568, which was filed on Aug. 5, 2011, which is incorporated herein by reference in its entirety, and additionally claims priority from German Application No. 102010039272.3, filed Aug. 12, 2010, which is also incorporated herein by reference in its entirety.

BACKGROUND OF THE INVENTION

Embodiments in accordance with the invention relate to a capacity measuring circuit. Further embodiments in accordance with the invention relate to a sensor system. Further embodiments in accordance with the invention relate to a method for measuring a capacity.

Embodiments in accordance with the invention relate to measuring capacities using delta-sigma modulators of narrow-band spurious emission.

Embodiments in accordance with the invention relate to a capacity-to-digital converter (CDC) (also referred to as "capacitive-to-digital converter") including sine excitation.

It is desirable in many technical fields to determine the quantity of a capacity. There are, for example, a plurality of different sensors in which a technical or physical measuring quantity to be detected has influence on the value of a sensor capacity. Thus, the value of the sensor capacity changes depending on the technical or physical quantity to be detected. It is desirable in many cases to provide a piece of digital information describing the value of the sensor capacity, which thus allows drawing conclusions as to the technical or physical quantity to be measured.

Irrespective of sensor technology, it is desirable in many cases to determine the value of a capacity at high precision. This exemplarily applies to the laboratory field where measuring a capacity is often necessitated for matching modules. Additionally, it may exemplarily be of importance to establish the value of a tuning capacity or matching capacity connected to an antenna structure.

In summary, one can see that capacitive sensors are widely used in measuring and sensor technology and that measuring a capacity is also frequently necessitated in other fields.

Furthermore, it is to be stated that there are different measuring methods for determining capacity values. Examples of known measuring methods are:

Detunable oscillators in which the frequency of the oscillation is influenced by the capacitive value.
Charge transfer methods in which a first capacity is charged in a first time phase and the charge is transferred to a second capacity in a second phase. Here, both the first capacity and the second capacity may be used as measuring capacity.
Synchronous demodulator method: the amplitude of a sine or square-wave oscillation is modulated by the change in capacity and transformed to a measuring signal using low-pass filtering.
Using standard sigma-delta modulators including pulsed charge transfer on sensor electronics: operating a delta-sigma modulator with a reference voltage at the input and evaluating changes in the capacity in the input branch.

Sigma-delta modulators are frequently used for measuring capacities. The structure and mode of functioning of conventional delta-sigma modulators will be discussed below briefly.

In this regard, reference is at first to be made to DE 10 2005 038 875 A1 which describes a capacity measuring circuit. The capacity measuring circuit includes a delta-sigma modulator comprising an operational amplifier, a first capacitor connectable to an input of the operational amplifier and a second capacitor in a feedback branch of the operational amplifier. The capacity measuring circuit additionally includes a reference signal source which is connectable to the first capacitor. The first or second capacitor here represents a capacity to be measured. In the capacity measuring circuit, it is not an input quantity at the input of the delta-sigma modulator that is measured and digitalized, but instead a defined reference signal source is connected at the input, and a component of the delta-sigma modulator itself represents the measuring quantity. The measuring result here is made available in a digital form.

WO 2006/098976 A2 describes an interface circuit for a capacitor including a terminal. The interface circuit for detecting the capacity of the capacitor includes a differential integrating amplifier including an input common mode voltage and two summarizing nodes, the voltage of which basically corresponds to the input common mode voltage. Additionally, the interface includes a switch circuit for charging the capacitor to a first voltage level in a first phase and for connecting the capacitor to one of the summarizing nodes of the differential amplifier in a second phase. This causes a first output change which is basically representative of the difference between the first voltage level and the input common mode voltage and which is also representative of the capacitor itself. In addition, the switch circuit is configured to charge the capacitor to a second voltage level in a third phase and to connect the capacitor to the other summarizing node of the differential amplifier in a fourth phase to thus provide a second output change which is basically representative of the difference between the second voltage level and the input common mode voltage and is also representative of the capacitor itself. The combined first and second output changes represent the capacity of the capacitor, basically irrespective of the input common mode voltage.

The principle of a delta-sigma modulator will be described below briefly referring to FIG. 8. FIG. 8 shows a block circuit diagram of a delta-sigma modulator. The delta-sigma modulator 800 in accordance with FIG. 8 includes an input-side summer 810 configured to receive a measuring quantity Umes, a switchable reference quantity UREFP or UREFN and, optionally, an offset quantity Uoff and to sum the quantities received with corresponding signs. The offset quantity Uoff may exemplarily be of a negative sign and exemplarily compensate the measuring quantity Umes at least partly. This means that, at an output of the summer 810, there is a quantity 812 which corresponds to a result of a summation (if needed, taking into account the signs) of the measuring quantity Umes, the offset quantity Uoff and the respective reference quantity UREFP or UREFN.

In addition, the delta-sigma modulator 800 includes an integrator 820 configured to receive and integrate the sum quantity 812, thus to obtain an integrator output signal 822.

Additionally, the delta-sigma modulator 800 includes a threshold value decider 830 configured to receive the integrator output signal or integrator result signal 822 and compare same to a threshold value so as to obtain a discrete-value (such as, for example, binary) output signal 832 representing a result of the comparison. Advantageously, the output signal 832 is of a discrete-time manner and thus represents a digital bit stream. The output signal 832 or the corresponding digital bit stream is also used to decide whether the summer 810 is fed a first reference quantity UREFP or a second reference quantity UREFN. Thus, the output signal 832 of the threshold value decider typically decides whether the output signal 812 of the summer 810 effects an upward integration or downward integration of the integrator 820.

Referring to FIG. 9, a conventional delta-sigma modulator for measuring a voltage signal will be described below in more detail. A somewhat simplified circuit diagram of such a sigma-delta modulator 900 is shown in FIG. 9.

The sigma-delta modulator 900 receives an input voltage vin and, based thereon, provides a digital bit stream 920 which describes the input voltage vin (exemplarily referenced to a reference potential GND). The sigma-delta modulator 900 includes, as a central element, an integrator 930 configured to integrate an electrical charge. For this purpose, the integrator 930 includes an operational amplifier 934 and an integration capacity Cint. A non-inverting input (+), for example, is coupled to the reference potential GND. The integration capacity Cint, for example, is connected between the inverting input (−) and the output of the operational amplifier 932. A node at the inverting input (−) of the operational amplifier 932 serves as a charge summation node since a charge flowing into this charge summation node 932 is integrated onto the integration capacity Cint. In this regard, it is also to be stated that the charge summation node 932 represents a virtual mass node since the operational amplifier 932—except for parasitic offset voltages—at least approximately causes the charge summation node 932 to be at the same potential as the non-inverting input (+), that is exemplarily at the reference potential. Additionally, normally it can be assumed that a charge flowing into the inverting operational amplifier input is negligibly small since the inputs of the operational amplifier 932 are typically of very high resistance.

The sigma-delta modulator 900 additionally comprises an input capacity Cin, the first terminal of which is connectable to the input voltage vin via a switch 940 in a first phase and to the reference potential GND in a second phase. A second terminal of the input capacity Cin is connectable to the reference potential GND via a switch 942 in a first phase and to the charge summation node 932 in a second phase. Thus, the input capacity Cin is charged in the first phase (switch position of the switches 940, 942 as shown in FIG. 9), wherein a charge deposited on the input capacity Cin depends on the quantity of the input voltage vin (referenced to the reference potential) and the quantity of the capacity Cin, wherein Qin=Cin*vin. In the second phase where the switch positions of the switches 940, 942 are opposite to the switch positions shown in FIG. 9, the input capacity Cin is discharged, wherein the charge deposited on the capacity Cin in the first phase is fed to the integration capacity Cint, if and insofar as same is not compensated by the charge from the feedback capacity Cfb and/or the offset capacity Coffset.

The sigma-delta modulator additionally includes a feedback branch. The feedback branch basically includes a threshold value comparer 950. The threshold value comparer 950 is, for example, configured to compare the voltage at the output of the operational amplifier 934 to the reference potential and to provide, depending on a result of the comparison, a first digital value or a second digital value at its output. The first digital value (such as, for example, logic "0") or second digital value (such as, for example, logic "1") here forms a bit of the digital bit stream 920. Additionally, the sigma-delta modulator includes a feedback charge provider 960 configured to feed, depending on the digital value at the output of the threshold value comparer 950, in a cycle of the sigma-delta modulator, a positive charge of a predetermined amount of charge or a negative charge of a predetermined amount of charge to the charge summation node 932. For this purpose, the feedback capacity Cfb is exemplarily discharged in a first phase via a first switch 962 and a second switch 964. In a second phase, a first terminal of the feedback capacity Cfb is optionally, depending on whether the output of the threshold value comparer 950 takes a first logic level or a second logic level, connected to a positive reference voltage vrefp or a negative reference voltage vrefn. At the same time, a second terminal of the feedback capacity Cfb is coupled to the charge summation node 932 in the second phase. Correspondingly, a feedback charge Qfb=Cfb*vrefp or a charge Qfb=Cfb*vrefn is provided to the summation node 932 using the feedback capacity Cfb, depending on whether the output of the threshold value comparer 950 in the respective cycle of the delta-sigma modulator takes a first logic value or a second logic value.

Optionally, during a cycle of the sigma-delta modulator, an offset charge may additionally be fed to the charge summation node 932 using an offset charge providing circuit 970 to exemplarily set an offset value of the sigma-delta modulator.

All in all, a digital bit stream 920 is generated, which (by driving the offset charge providing circuit 960) causes the charge fed to the charge summation node 932 via the input capacity Cin to be basically compensated by the sum of the charge fed to the charge summation node 932 by the feedback charge providing circuit 960 and (optionally) by the offset charge providing circuit 970. The digital bit stream thus indicates for a sequence of cycles of the sigma-delta modulator whether a positive feedback charge or a negative feedback charge is to be fed to the charge summation node 932 in order to reduce the level at the output of the operational amplifier 932 to the threshold value of the threshold value comparer 950. Thus, the digital bit stream 920 is a measure of a charge Qin fed to the charge summation node 932 in a cycle of the sigma-delta modulator, which in turn is a product of the input voltage vin and the input capacity Cin.

A capacity measuring circuit (also referred to as "capacitive measuring circuit") 1000 using a "standard" sigma-delta modulator will be described below referring to FIG. 10. This circuit differs only slightly from the sigma-delta modulator 900 in accordance with FIG. 9 which serves for measuring a voltage signal so that only the differences will be explained. Furthermore, same means or means of the same effect are provided with the same reference numerals and will not be discussed again.

The measuring circuit 1000 differs from the measuring circuit 900 in accordance with FIG. 9 as to how the input charge is fed to the charge summation node 932. The capacity measuring circuit 1000 here includes a capacity or sensor capacity Csensor to be measured which is discharged in a first phase using switches 1040, 1042. The capacity or sensor capacity Csensor to be measured is additionally connected between a predetermined, typically constant-time reference potential vrefn or reference potential vrefp and the charge summation node 932 in a second phase via the switches 1040, 1042 such that the charge summation node here is fed a charge Qsensor=vrefn*Csensor and Qsensor=vrefp*Csensor, respectively, in a cycle of the capacity measuring circuit. The charge fed to the charge summation node 932 due to the capacity or sensor capacity Csensor to be measured is, due to the fact that the voltage vrefn or vrefp is predetermined and known, a measure of the unknown capacity or capacity to be measured Csensor. This charge Qsensor deposited due to the capacity to the measured or sensor capacity Csensor is determined by the sigma-delta converter such that the digital bit stream 920 describes the charge Qsensor and, thus, also describes the capacity Csensor.

Although sigma-delta modulators are frequently used for measuring capacities, as is exemplarily described referring to FIG. 10, it has been found out that there are problems with broad-band spurious emission in some applications due to the pulsed recharge of the sensor capacity (such as, for example, the capacity Csensor in accordance with FIG. 10).

It has been found out that this exemplarily is the case when this method (such as, for example, the method described referring to FIG. 10) is used for monitoring electrically driven windows and doors in the closing process so as to avoid unintentional trapping of persons and objects.

It has been found out that the antenna-like structure of the sensor capacity causes broad-band emission of electromagnetic waves by the pulsed recharge currents, caused by the nearly square wave-pulsed driving of the sensor capacity.

It has additionally been found out that this results in threshold values with regard to electromagnetic compatibility to be exceeded in different applications. When being used in the automobile industry, this may result in an audible disturbance in radio receiving which can hardly be avoided since the spectral band emitted can be identified up into the gigahertz range.

Narrow-band measuring methods are conventionally used in order to reduce or avoid the problems mentioned with regard to electromagnetic compatibility. Such narrow-band measuring methods frequently use synchronous demodulators or lock-in amplifiers. This limits spurious emission to a small band. However, these methods are of considerable disadvantage as far as offset compensation, amplification setting and measuring frequency switching are concerned.

SUMMARY

According to an embodiment, a capacity measuring circuit may have: a measuring voltage source configured to feed a sinusoidal voltage signal to a first terminal of a capacity to be measured so as to cause a temporal change in a charge stored on the capacity to be measured; and a delta-sigma modulator, the delta-sigma modulator being configured to receive a charge from a second terminal of the capacity to be measured and to provide a digital output signal which depends on a quantity of the charge received from the capacity to be measured; wherein the capacity measuring circuit is configured to bring the capacity to be measured to a first charge state in a first phase using the sinusoidal voltage signal and to bring the capacity to be measured to a second charge state in a second phase using the sinusoidal voltage signal; and wherein the delta-sigma modulator is configured to receive an amount of charge equaling a difference between an amount of charge stored on the capacity to be measured in the first charge state and an amount of charge stored on the capacity to be measured in the second charge state and to provide the digital output signal in dependence on the amount of charge received.

According to another embodiment, a sensor system may have: a sensor capacity configured to change a capacity value by at least 20% in dependence on a quantity to be measured; and a capacity measuring circuit as cited before, wherein the capacity measuring circuit is coupled to the sensor capacity such that the sensor capacity represents the capacity to be measured.

According to still another embodiment, a method for determining a capacity value of a capacity to be measured may have the steps of: feeding a sinusoidal voltage signal to a first terminal of the capacity to be measured; receiving a charge from a second terminal of the capacity to be measured; and proving a digital output signal such that the digital output signal is dependent on a quantity of the charge received from the capacity to be measured; wherein the capacity to be measured is placed in a first charge state using the sinusoidal voltage signal in a first phase, and wherein the capacity to be measured is placed in a second charge state using the sinusoidal voltage signal in a second phase; and wherein the digital output signal is provided using a delta-sigma modulation, in dependence on an amount of charge equaling a difference between an amount of charge stored on the capacity to be measured in the first charge state and an amount of charge stored on the capacity to be measured in the second charge state.

An embodiment in accordance with the invention provides a capacity measuring circuit including a measuring voltage source configured to feed an—at least approximately—sinusoidal voltage signal to a first terminal of a capacity to be measured so as to cause a temporal change in a charge stored in the capacity to be measured. The capacity measuring circuit additionally includes a delta-sigma modulator. The delta-sigma modulator is configured to obtain a charge from a second terminal of the capacity to be measured and to provide a digital output signal which depends on a quantity of the charge obtained from the capacity to be measured.

This embodiment in accordance with the invention is based on the finding that a reliable measurement of a capacity using a delta-sigma modulator will also be possible if an—at least approximately—sinusoidal signal, instead of the conventionally used square-wave signal, is applied to a first terminal of the capacity to be measured, wherein using an at least approximately sinusoidal signal entails the essential advantage that spurious emission by an electrode of the sensor capacity (and by corresponding feed lines may be present) is only of a very narrow band. Thus, the electromagnetic compatibility is improved considerably in the inventive circuit compared to conventional circuits in which an approximately square-wave signal is applied to a terminal of the capacity to be measured, without considerably deteriorating the precision of the capacity measurement by using an at least approximately sinusoidal signal.

The inventive capacity measuring circuit causes considerable advantages since an essentially sinusoidal voltage signal is applied to the first terminal of the capacity which results in a narrow-band and thus comparably "harmless" spurious emission, easy to be filtered out. Furthermore, a capacity value of the capacity to be measured may be determined at high precision by transferring a charge from the capacity to be measured to the delta-sigma modulator. Due to using a delta-sigma modulator for determining the capacity value, measuring errors are typically smaller than when using a synchronous demodulator or a lock-in amplifier.

In an embodiment, the capacity measuring circuit is configured to place the capacity to be measured in a first charge state in a first phase using the sinusoidal voltage signal and to place the capacity to be measured in a second charge state in a second phase using the sinusoidal voltage signal. The delta-sigma modulator in this case is configured to receive an amount of charge equaling a difference between an amount of charge stored on the capacity to be measured in the first charge state and an amount of charge stored on the capacity to be measured in the second charge state and to provide the digital output signal in dependence on the amount of charge received. It has been found out that an at least approximately sinusoidal voltage signal is also very suitable for placing the capacity to be measured into two well-defined charge states such that a difference between the amount of charges stored on the capacity to be measured is a precise measure of a capacity value of the capacity to be measured and may be evaluated by the delta-sigma modulator.

In an embodiment, the delta-sigma modulator comprises an integration capacity. In this case, the delta-sigma modulator is configured to separate the second terminal of the capacity to be measured from the integration capacity in the first phase and to couple the second terminal of the capacity to be measured to the integration capacity in the second phase. Thus, the charge on the integration capacity in the second phase is changed or influenced by changing the charge stored on the capacity to be measured. This allows precisely determining the capacity value since the amount of charge transferred from the capacity to be measured onto the integration capacity is essentially proportional to a product of the capacity value of the capacity to be measured and the voltage difference at the first terminal of the capacity between the end of the first phase and the end of the second phase. The latter voltage change can typically be determined or fixed at high precision.

In an embodiment, the delta-sigma modulator is configured to pull the second terminal of the capacity to be measured to a predetermined constant potential, except for short (parasitic and not absolutely necessary) transition phases during which the second terminal of the capacity to be measured is in an electrically floating state. By setting or applying an approximately constant second potential (referenced to a reference potential) to the second terminal of the capacity to be measured, spurious emissions by the second electrode of the capacity to be measured are essentially avoided. Thus, typically an approximately sinusoidal voltage course is applied to the first electrode of the capacity to be measured, whereas a constant voltage (or constant potential) is applied to the second electrode of the capacity to be measured. This means that the capacity to be measured causes only a small and essentially narrow-band spurious emission, which is of particular advantage in cases in which the capacity to be measured is spatially great and thus exhibits a marked tendency for emissions.

In an embodiment, the measuring voltage source is configured to feed a frequency-stable and amplitude-stable sinusoidal voltage signal to the capacity to be measured during capacity measurement. A sinusoidal voltage signal which is frequency-stable (such as, for example, within a frequency tolerance of, for example, +/−5% or even +/−1%) and amplitude-stable (such as, for example, within a tolerance of +/−10% or even +/−2%) over a plurality of three or even more periods (exemplarily at least 20 periods or at least 100 periods or even at least 1000 periods) exhibits a comparably narrow spectrum and thus entails only narrow-band interferences.

In an embodiment, the measuring voltage source is configured to feed the frequency-stable and amplitude-stable sinusoidal voltage signal in an uninterrupted manner to the first terminal of the capacity to be measured for at least three periods.

In an embodiment, the capacity measuring circuit is configured to generate a periodic voltage course at the capacity to be measured such that voltage values over the capacity to be measured differ from voltage values of a sinusoidal voltage course during a period by at most 10% referenced to an amplitude of the sinusoidal voltage course. This in turn ensures that spurious emission by the capacity to be measured is kept small.

In an embodiment, the delta-sigma modulator is configured to connect the second terminal of the capacity to be measured to a reference potential feed in the first phase and to connect the second terminal of the capacity to be measured to a virtual mass node in the second phase and to detect a charge stored on the capacity to be measured during the second phase. A corresponding procedure allows placing the capacity to be measured in a first charge state in the first phase, without thereby changing an amount of charge stored in the integration capacity of the delta-sigma modulator. However, during the second phase, the charge stored in the capacity to be measured changes since typically the voltage applied to the first terminal of the capacity to be measured towards the end of the second phase differs from the voltage applied to the first terminal of the capacity to be measured at the end of the first phase. The charge change caused by this voltage change is detected by the delta-sigma modulator and (typically in connection with a charge provided by a feedback capacity and a charge provided by an offset capacity) contributes to a change in the amount of charge stored on the integration capacity of the delta-sigma modulator.

In an embodiment, the capacity measuring circuit is configured such that the approximately sinusoidal voltage signal provided by the measuring voltage source is synchronized with operating phases of the delta-sigma modulator. Corresponding synchronization ensures that a well-defined charge change which is a measure of a capacity value of the capacity to be measured results due to the sinusoidal voltage signal applied to the first terminal of the capacity to be measured during the operating phases of the delta-sigma modulator or between the operating phases of the delta-sigma modulator.

In an embodiment, the delta-sigma modulator is configured to effect a transition between a first base during which the second terminal of the capacity to be measured is separated from an integration capacity of the delta-sigma modulator and a second phase during which the second terminal of the capacity to be measured is coupled to the integration capacity, at least approximately (such as, for example, within a tolerance of +/−10% or +/−5% of a period duration) at the time of a maximum of the (at least approximately) sinusoidal voltage signal or at the time of a minimum of the (at least approximately) sinusoidal voltage signal. Such a setting of the temporal courses has the result that switching between the first phase and the second phase takes place at a time when the voltage applied to the first terminal of the capacity to be measured changes only slightly over time. Thus, the point of switching between the first phase and the second phase is not much critical and hardly corrupts the measuring result. In addition, such a setting of the time of switching typically does not result in significant interferences in the voltage on the second electrode of the capacity to be measured which in turn results in little spurious emission.

In an embodiment, the delta-sigma modulator comprises a charge integrator including an input-side charge summation node and an integration result output. The charge integrator here is configured to integrate a charge received at the input-side charge summation node so as to obtain the signal at the integration result output. The delta-sigma modulator additionally comprises a threshold value comparator configured to compare a level applied to the integration result output of the charge integrator which describes an integral of the charge received at the charge summation node, to a threshold value and to provide a discrete value in dependence on a result of the comparison. The delta-sigma modulator is additionally configured to receive a charge from the second terminal of the capacity to be measured at the charge summation node and to additionally feed an amount of charge depending on the result of the comparison to the charge summation node. This means that the delta-sigma modulator realizes a principle of determining the amount of charge provided by the capacity to be measured by feedback amount of charge compensation, the result being a discrete-value signal.

In an embodiment, the delta-sigma modulator is thus configured to feed the charge summation mode, in a phase of the delta-sigma modulator (which is, for example, part of a duty cycle), a predetermined amount of charge which at least partly compensates an amount of charge received from the capacity to be measured.

In another embodiment, the delta-sigma modulator includes an offset capacity including a first terminal and a second terminal. In this case, the delta-sigma modulator is configured to apply an (at least approximately) sinusoidal voltage signal to the first terminal of the offset capacity and to cyclically couple the second terminal of the offset capacity to the charge summation node and separate same from the charge summation node. In this way, an at least approximately sinusoidal voltage signal is applied to the first electrode of the offset capacity which in turn is of great advantage for avoiding broadband interferences. Additionally, by cyclically coupling the second terminal of the offset capacity to the charge summation mode, a well-defined amount of charge which contributes to an at least partial compensation of the charge received from the capacity to be measured or even causes over-compensation of the charge received from the capacity to be measured can be fed to the charge summation node.

In an embodiment, the delta-sigma modulator is configured to apply to the first terminal of the offset capacity an at least approximately sinusoidal voltage signal which is opposite in phase compared to the approximately sinusoidal voltage signal provided by the measuring voltage source. The delta-sigma modulator here is configured to connect the second terminal of the offset capacity and the second terminal of the capacity to be measured to the charge summation node during identical time intervals. In this way, it is possible to achieve offset compensation in a very precise manner, offset compensation here being subject to small tolerances.

In an embodiment, the delta-sigma modulator is configured to connect the second terminal of the offset capacity and the second terminal of the capacity to be measured to the charge summation node via a common switch. This represents a particularly efficient realization.

In another embodiment, the delta-sigma modulator is configured to apply to the charge summation node at least a sector of a sinusoidal current course. This in turn allows providing a compensation charge in a comparably low-interference manner.

Another embodiment includes a sensor system including a sensor capacity configured to change a capacity value in dependence on a quantity to be measured by at least 20%. In addition, the sensor system includes a capacity measuring circuit described above. The capacity measuring circuit here is coupled to the sensor capacity such that the sensor capacity represents the capacity to be measured. Such a sensor system offers the advantages already discussed above.

In an embodiment, the capacity measuring circuit in the sensor system mentioned is configured to perform, assuming a known amplitude of the sinusoidal voltage signal provided by the measuring voltage source, an evaluation so as to obtain information describing the capacity value of the sensor capacity. Correspondingly, conclusions can be drawn as to the capacity value of the sensor capacity and the information on the capacity value of the sensor capacity may be output or processed so as to obtain, for example, information on a state of an apparatus.

In an embodiment in accordance with the invention, the sensor capacity represents an input capacity of the delta-sigma modulator.

Another embodiment in accordance with the invention provides a method for measuring a capacity. This method is based on the same findings as the capacity measuring circuit described above.

BRIEF DESCRIPTION OF THE DRAWINGS

Embodiments in accordance with the present invention will be detailed subsequently referring to the appended drawings, in which.

DETAILED DESCRIPTION OF THE INVENTION

1. Capacity Measuring Circuit in Accordance with FIG. 1

Figure 1:
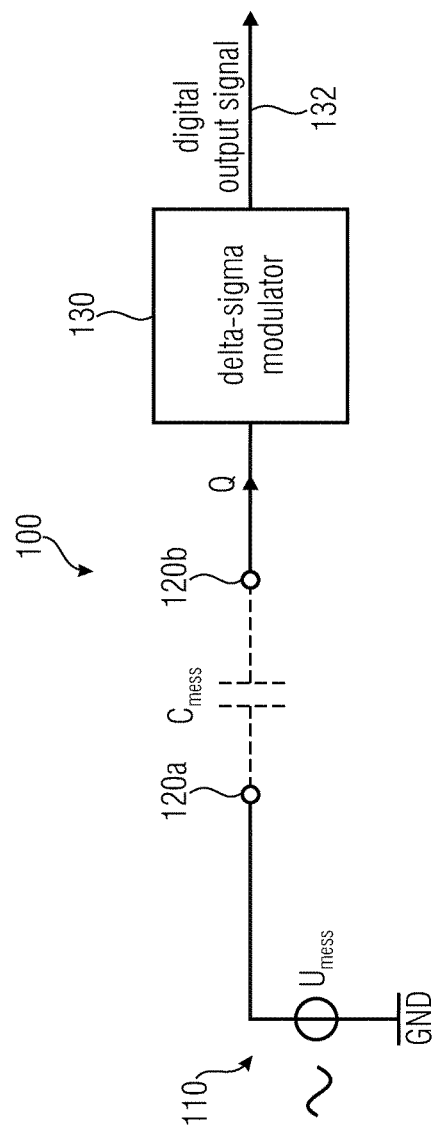
FIG. 1 shows a block circuit diagram of a capacity measuring circuit in accordance with an embodiment of the present invention.

FIG. 1 shows a block circuit diagram of a capacity measuring circuit 100 in accordance with an embodiment of the invention. The capacity measuring circuit 100 includes a measuring voltage source 110 configured to feed a first terminal 120a of a capacity to be measured Cmess a sinusoidal voltage signal so as to cause a temporal change in a charge stored in the capacity to be measured Cmess. The capacity measuring circuit 100 additionally includes a delta-sigma modulator 130. The delta-sigma modulator 130 is configured to receive a charge from a second terminal 120b of the capacity to be measured Cmess and to provide a digital output signal 132 which depends on a quantity of the charge received from the capacity to be measured Cmess.

With regard to the mode of operation of the capacity measuring circuit 100, it is to be mentioned that a temporal change of the charge stored in the capacity to be measured Cmess is caused by the sinusoidal voltage signal 100 applied to the first terminal 120a of the capacity to be measured Cmess. This means that typically the result is an increase in the charge stored on the capacity to be measured Cmess during a part of a period of the sinusoidal voltage signal (exemplarily during a first phase). However, during a second phase which exemplarily represents part of a period of the sinusoidal voltage signal, the result is a decrease in a charge stored on the capacity to be measured Cmess (or a change in sign in the charge stored). The delta-sigma modulator 130 here is configured to receive from the second terminal of the capacity to be measured Cmess a charge which exemplarily drains from the capacity to be measured Cmess, wherein a temporal change in the sinusoidal voltage signal applied to the first terminal 120a of the capacity to be measured Cmess may be the cause for a charge draining from the capacity Cmess. The delta-sigma modulator 130 here is able to provide the digital output signal 132 such that the digital output signal 132 describes a quantity of the charge Q received from the capacity to be measured. This means that the digital output signal 132 at the same time describes the capacity to be measured Cmess, assuming that a voltage course of the sinusoidal voltage signal is known, since typically the charge Q received is proportional to a capacity value of the capacity to be measured Cmess.

In this regard, the digital output signal 132 allows an evaluation to be performed so as to draw conclusions as to the capacity value of the capacity to be measured Cmess, which is really done in some embodiments.

Further details as to how the capacity measuring circuit 100 may be set up will be described below.

Additionally, it is also to be pointed out that a sinusoidal voltage signal here also means an approximately sinusoidal voltage signal. It has, for example, been found out that a deviation of the voltage signal provided by the measuring voltage source 100 from an ideal sinusoidal voltage course of, for example, 10% referenced to an amplitude of the ideal sinusoidal voltage course will typically still result in good results. In particular, using an at least approximately sinusoidal voltage signal avoids a voltage course on the electrodes of the capacity to be measured or a current course in the feed lines coupled the capacity to be measured Cmess from including strong harmonic portions.

In this regard, an electromagnetic compatibility of the capacity measuring circuit 100 typically is considerably better than the electromagnetic compatibility of conventional capacity measuring circuits using a delta-sigma modulator.

2. Capacity Measuring Circuit in Accordance with FIG. 2

Figure 2:
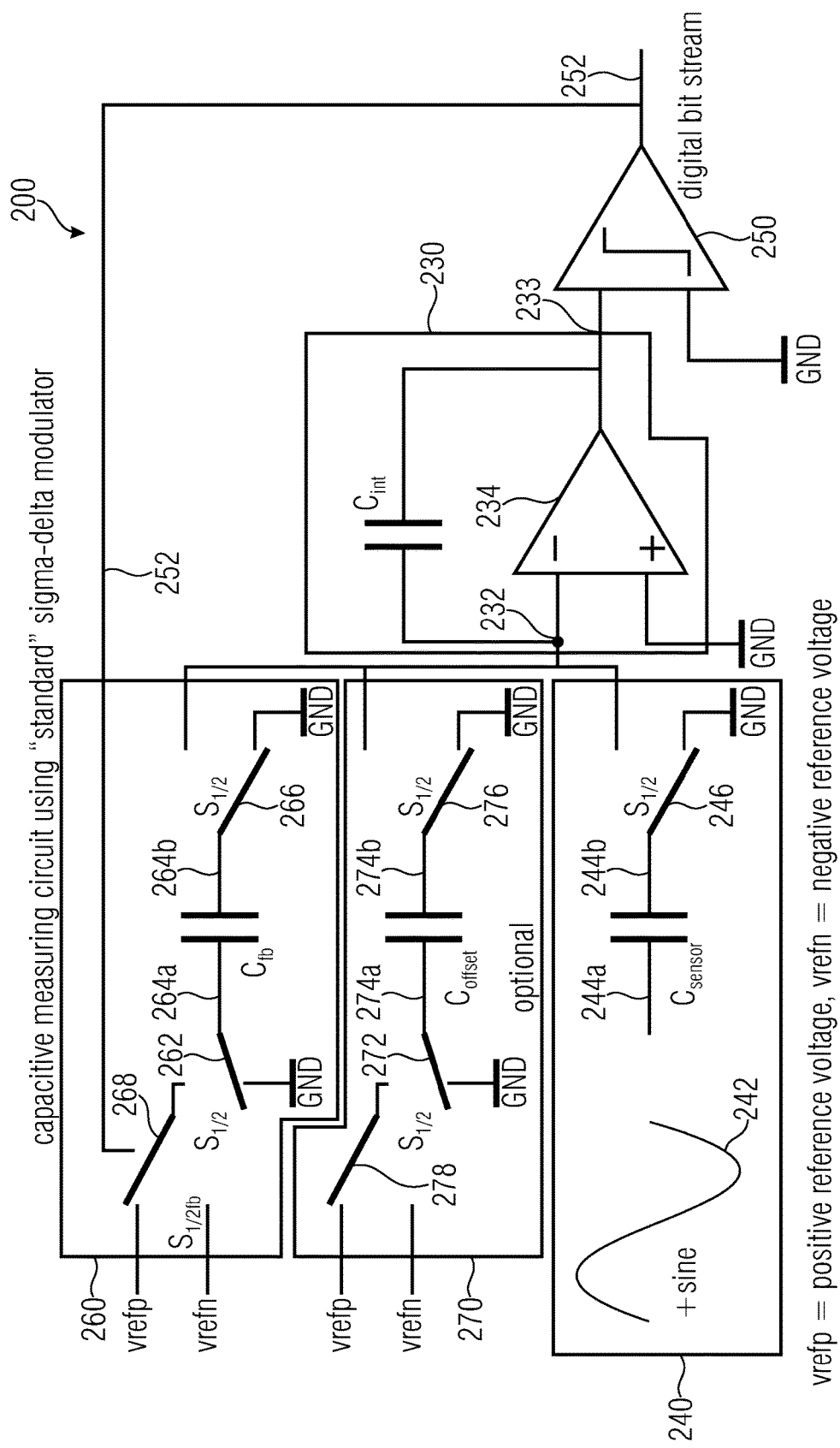
FIG. 2 shows a detailed circuit diagram of a capacity measuring circuit in accordance with an embodiment of the present invention.

A capacity measuring circuit will be discussed in greater detail below referring to FIG. 2. FIG. 2 shows a detailed circuit diagram of such a capacity measuring circuit 200.

The capacity measuring circuit 200 includes a charge integrator 230 as a central element. The charge integrator 230 comprises an input-side charge summation node 232 and an integration result output 233.

Additionally, the capacity measuring circuit comprises a measuring charge providing circuit 240 configured to feed the charge summation node 232 a (positive or negative) amount of charge the quantity of which depends on a capacity value of the capacity to be measured Csensor.

The capacity measuring circuit 200 additionally comprises a feedback charge providing circuit 260 configured to feed the charge summation node 232 a (positive or negative) amount of charge in dependence on a control signal 252. The control signal 252 decides on whether the feedback charge providing circuit 260 feeds the charge summation node 232 a first amount of charge (such as, for example, a positive amount of charge) or a second amount of charge (such as, for example, a negative amount of charge).

The capacity measuring circuit additionally includes an offset charge provider 270 configured to feed the charge summation node 232 a predetermined fixed or selectable amount of charge during a clock cycle of the delta-sigma modulator. Besides, the offset charge provider 270 is optional.

The capacity measuring circuit additionally includes a threshold value decider 250. An input of the threshold value decider 250, for example, is coupled to the integration result output 233 of the charge integrator 230. A second input (such as, for example, a reference input) of the threshold value decider 250, for example, is coupled to the reference potential GND. An output of the threshold value decider 250 provides a digital bit stream 252, such as, for example, a discrete-time sequence of two different values (such as, for example, logic "0" and logic "1"). The values of the digital bit stream 252 may at the same time represent the control signal for the feedback charge provider 260 and thus decide whether a first amount of charge (such as, for example, a positive amount of charge) or a second amount of charge (such as, for example, a negative amount of charge) is fed to the charge summation node 232 by the feedback charge provider 260 during a (clock) cycle of the delta-sigma modulator.

The structure of the individual components of the capacity measuring circuit 200 will be described below in greater detail.

The charge integrator 230, for example, includes an operational amplifier 234 and a charge integration capacity Cint. A non-inverting input (+) of the operational amplifier 234, for example, is coupled to the reference potential GND. An inverting input (−) of the operational amplifier 234 is coupled to the charge summation node 232. The integration capacity Cint is connected between the charge summation node 232 and an output of the operational amplifier 234. The operational amplifier 234 thus—within what is possible and within spurious interference quantities, such as, for example, an input offset voltage—ensures that the potential at the charge integration node 232 equals the reference potential GND. In addition, the inputs of the operational amplifier 234 are typically of high resistance (input resistance in the range of mega ohms) such that only a negligibly small current flows into and from the inputs of the operational amplifier. The integration capacity Cint thus integrates the sum of charges (positive and negative charges) which are fed to the charge summation node 232 by the measuring charge provider 240, the feedback charge provider 260 and, maybe, the offset charge provider 270. A voltage at the integration result output 233, for example, is proportional to a quantity of the charge integrated onto the integration capacity Cint, wherein this charge may, for example, be both positive and negative.

The threshold value comparer 250, for example, compares the voltage level at the integration result output 233 to a predetermined reference value, such as, for example, to the reference potential GND. The threshold value comparer 250 thus provides at its output a discrete-value (such as, for example, binary or three-valued) signal indicating whether the voltage level at the integration result output 233 is greater or smaller than a reference voltage (which may, for example, equal 0, referenced to the reference potential). This means that the threshold value comparer 250, for example, provides a discrete-value (such as, for example, binary) signal describing a quantity of the charge stored on the integration capacity Cint and/or a sign of the charge stored on the integration capacity Cint. The output signal of the threshold value comparer 250 may also be updated in a clocked manner so as to obtain a discrete-time and discrete-value digital bit stream 252.

The measuring charge provider 240, for example, includes a measuring voltage source which provides an at least approximately sinusoidal voltage signal 242. The measuring voltage signal 242, for example, is fed to a capacity to be measured or a sensor capacity Csensor at a first terminal 244a. A second terminal 244b of the capacity to be measured may be coupled via a switch 246 to, alternatively, a reference potential feed for the reference potential GND or the charge summation node 232. Typically, the measuring charge provider 240 is configured such that the second terminal 244b of the capacity to be measured is coupled to the reference potential feed for the reference potential GND during a first phase and such that the second terminal 244b of the capacity to be measured Csensor is coupled instead to the charge summation node 232 during a second phase which is not overlapping in time relative to the first phase. Thus, a first amount of charge the final value of which is basically determined by a product of the quantity of the sensor capacity Csensor and a voltage value of the sinusoidal voltage at the first terminal 244a of the capacity to be measured Csensor at the end of the first phase is applied to the capacity to be measured Csensor in the first phase in which the second terminal 244b of the capacity to be measured Csensor is coupled to the reference potential feed.

By connecting the second terminal 244b to the reference potential feed, it is ensured that the reference potential GND is basically applied to the second terminal 244b during the first phase.

During the second phase, it is ensured by the operational amplifier 234 that the reference potential GND is also applied to the second terminal 244b since the charge summation node 232 acts as a virtual mass node.

Thus, an amount of charge stored on the capacity to be measured changes during the second phase, wherein the amount of charge present on the capacity to be measured at the end of the second phase is basically determined by a product of the capacity value of the capacity to be measured Csensor and a voltage value applied to the first terminal 244a at the end of the second phase (referenced to the reference potential GND). Additionally, it may typically be assumed that the same amount of charge is usually stored on the capacity to be measured Csensor at the beginning of the second phase as is at the end of the first phase.

The result is that the amount of charge stored on the capacity Csensor changes during the second phase from the amount of charge stored at the end of the first phase to the amount of charge stored at the end of the second phase. The change in the amount of charge thus basically corresponds to a product of the capacity value of the capacity to be measured Csensor and the difference between two voltage values U1, U2 present at the first terminal 244a of the capacity to be measured Csensor at the end of the first phase and at the end of the second phase, respectively. An amount of charge equaling the difference between an amount of charge stored on the capacity C sensor at the end of the first phase and the amount of charge stored on the capacity Csensor at the end of the second phase is fed to the charge summation node 232 by the measuring charge providing circuit 240 during the second phase. The corresponding amount of charge may be positive or negative, depending on whether the voltage at the first terminal 244a at the end of the first phase is greater or smaller than the voltage at the first terminal 244a at the end of the second phase.

It is also to be pointed out that the capacity to be measured Csensor in some embodiments may be part of the delta-sigma modulator. Exemplarily, the capacity to be measured Csensor may represent an input capacity of the delta-sigma modulator. However, the capacity to be measured Csensor may in other embodiments also be external of the delta-sigma modulator and may exemplarily be arranged to be remote from the actual delta-sigma modulator circuit.

The feedback charge providing circuit 260 also includes a feedback capacity Cfb. A first terminal 264a of the feedback capacity Cfb may be coupled via a switch 262 (first switch of the feedback charge providing circuit 260) alternatively to a reference potential feed for a reference potential GND and a central terminal of a switch 268 (third switch of the feedback charge providing circuit 260).

A second terminal 264b of the feedback capacity Cfb may be coupled via a switch 266 (second switch of the feedback charge providing circuit 260) alternatively to a reference potential feed for the reference potential GND and the charge summation node 232. The switches 262, 266 are typically driven such that in the first phase of the delta-sigma modulator the two terminals 264a, 264b of the feedback capacity may be coupled to a reference potential feed for the reference potential GND such that the feedback capacity Cfb is discharged during the first phase. However, during the second phase, the first terminal 264a of the feedback capacity Cfb, for example, is coupled to the central terminal of the switch 268 and the second terminal 264b is coupled to the charge summation node 232. In the second phase, the result is that the first terminal 264a of the feedback capacity Cfb is coupled to a positive reference potential vrefp or a negative reference potential vrefn via the switch 262 and the switch 268 in dependence on a current (or previous) value of the digital bit stream 252.

Thus, an overall positive charge of the quantity Qfb+=Cfb*vrefp is fed by the feedback charge provider 260 to the charge summation node 232 in the second phase when the current value of the digital bit stream 252 takes a first value. Alternatively, a negative charge Qfb−=Cfb*vrefn is fed to the charge summation node 232 by the feedback charge provider 260 when the current value of the digital bit stream 252 takes a second value. All in all, the feedback charge provider 260 thus serves for feeding the charge summation node 232 alternatively a predetermined positive amount of charge or a predetermined negative amount of charge in the second phase of the delta-sigma modulator, depending on the current value of the digital bit stream 252.

The offset charge providing circuit 270, for example, includes an offset capacity Coffset. A first terminal 274s of the offset capacity may be coupled to a reference potential feed for the reference potential GND via a switch 272 (first switch of the offset charge providing circuit 270) and may additionally be coupled to a central tap of a switch 278 (third switch of the offset charge providing circuit 270) via the switch 272. A second terminal 274b of the offset capacity Coffset may be coupled alternatively to a reference potential feed for the reference potential GND and the charge summation node 232 via a switch 276 (second switch of the offset charge providing circuit 270). In the first phase of the sigma-delta modulator, typically both the first terminal 274a of the offset capacity Coffset and the second terminal 274b of the offset capacity Coffset are coupled to the reference potential feed for the reference potential GND via the switches 272, 276 such that the offset capacity Coffset is discharged during the first phase. In the second phase, however, the first terminal 274a of the offset capacity Coffset is coupled to a predetermined reference potential via the switches 272, 278, exemplarily to the positive reference potential vrefp or the negative reference potential vrefn. At the same time, in the second phase, the second terminal 274b of the offset capacity Coffset is coupled to the charge summation node 232 via the switch 276.

This means that the charge summation node 232 is in effect fed a charge by the offset charge providing circuit during the second phase, wherein the charge fed by the offset charge providing circuit Qoffset is determined by the product of a capacity value of the offset capacity Coffset and a corresponding voltage (such as, for example, vrefp, vrefn) applied to the first terminal 274a of the offset capacity Coffset in the second phase. In this regard, the optional offset charge providing circuit 270 is configured to feed the charge summation node 232, in the second phase, a predetermined amount of charge which at least partly compensates, and in some cases even over-compensates, the charge fed to the charge summation node by the measuring charge providing circuit 240.

With regard to the mode of functioning of the entire circuit 200, it may be stated that, during a cycle which exemplarily includes the first phase and the second phase as non-overlapping phases, the charge summation node 232 is fed an amount of charge Qsensor by measuring charge providing circuit 240, is fed an amount of charge Qoffset by the offset charge providing circuit 270 and is fed an amount of charge Qfb by the feedback charge providing circuit 260.

With a predetermined and known amplitude of the sinusoidal alternating voltage applied to the first terminal 244a of the capacity to be measured Csensor and with a constant temporal synchronization between the sinusoidal alternating voltage and the phases of the sigma-delta modulator, for example, the charge fed to the charge summation node 232 by the measuring charge providing circuit 240 is basically proportional to the capacity value of the capacity to be measured. The amount of charge provided to the charge summation node 232 by the offset charge providing circuit 270 is basically constant, since it may be assumed that the voltage fed to the first terminal 274a of the offset capacity Coffset in the second phase is basically constant and that a capacity value of the offset capacity basically is also constant or at least predetermined fixedly (and known).

The charge fed to the charge summation node 232 by the feedback charge providing circuit 260 takes one of two known values, depending on the current value of the digital bit stream 252. Whether the charge summation node 232 is fed a positive charge or a negative charge by the feedback charge providing circuit 260 in a predetermined cycle during the second phase essentially depends on whether the charge on the integration capacity Cint at the end of the previous cycle has been positive or negative. Thus, when there has been a positive charge on the integration capacity Cint in the previous cycle, the effect is that the charge on the integration capacity Cint is diminished (becomes less positive or even negative). In contrast, when a negative charge has been present on the integration capacity Cint in the previous cycle, the effect is that the charge on the integration capacity Cint becomes more positive. How often (in a sequence of cycles of the delta-sigma modulator) the charge summation node 232 is provided with a positive charge and a negative charge by the feedback charge providing circuit 260 depends on how big the sum of the charge Qsensor and the charge Qoffset is and whether the sum of the charges Qsensor and Qoffset is positive or negative. Depending on which value the sum Qsensor+Qoffset takes, the digital bit stream 252 includes, for example, more or less zeros or ones. For example, when Qsensor+Qoffset=0, it may, at least approximately, be expected that the digital bit stream 252 includes the same number of zeros and ones. However, when Qoffset+Qsensor is greater than 0 or smaller than 0, the equilibrium of zeros and ones is displaced and there will either be more zeros or ones in the digital bit stream 252.

3. Capacity Measuring Circuit in Accordance with FIG. 3

Figure 3:
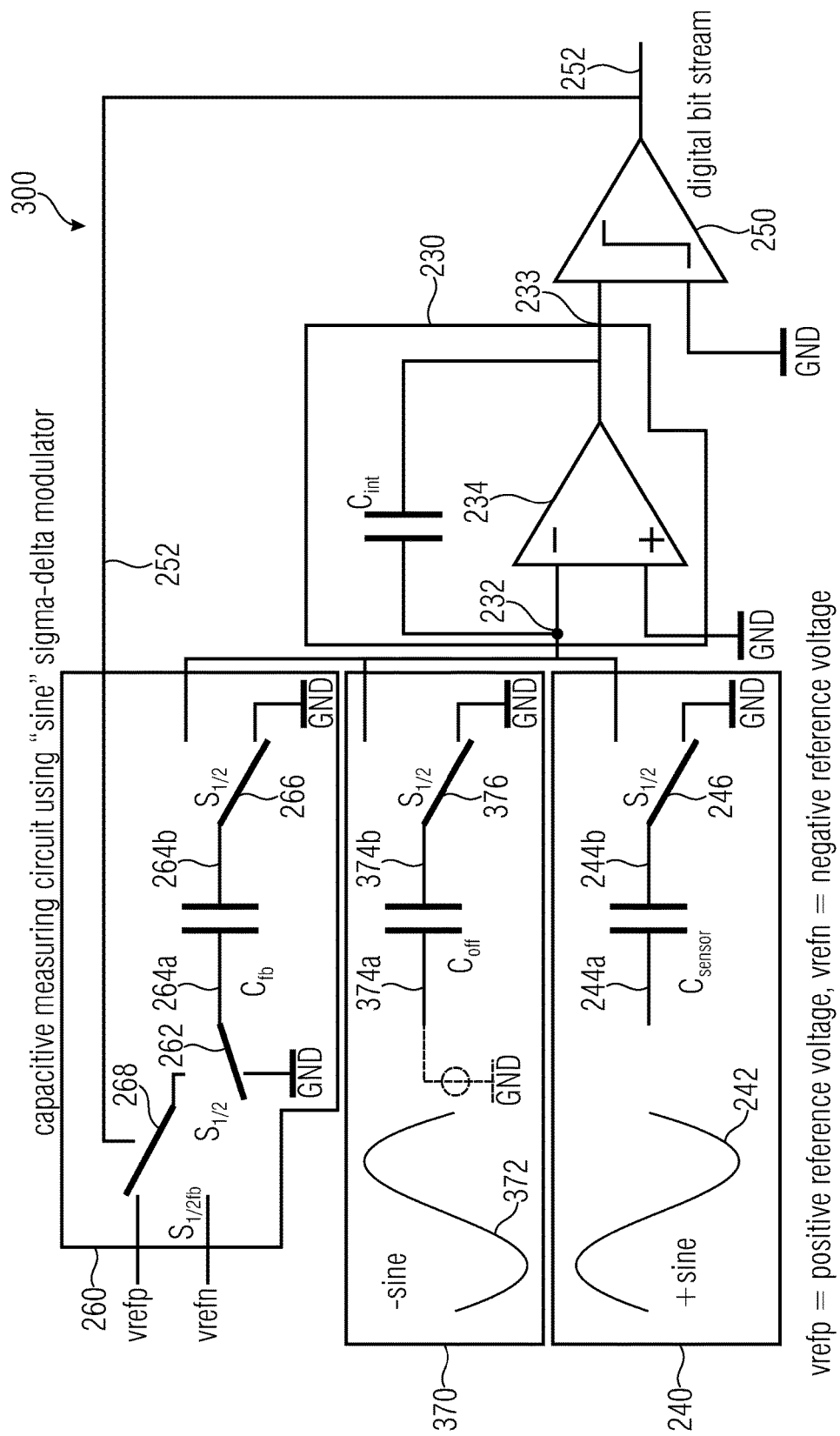
FIG. 3 shows a detailed circuit diagram of a capacity measuring circuit in accordance with another embodiment of the invention.

Another embodiment of an inventive capacity measuring circuit will be described below briefly referring to FIG. 3. FIG. 3 shows a detailed circuit diagram of such a capacity measuring circuit 300. The capacity measuring circuit 300 is very similar in its setup and its mode of functioning to the capacity measuring circuit 200 in accordance with FIG. 2. Same circuit elements and signals or those having the same effect are referred to by the same reference numbers and will not be discussed here again.

The capacity measuring circuit 300 in accordance with FIG. 3 basically differs from the capacity measuring circuit 200 in accordance with FIG. 2 in that the offset charge providing circuit 270 is replaced by a modified offset charge providing circuit 370.

The modified offset charge providing circuit 370 includes an offset capacity Coff. The modified offset charge providing circuit 370 additionally includes a voltage source configured to apply an at least approximately sinusoidal voltage signal 372 to a first terminal 374a of the offset capacity Coff. The modified offset charge providing circuit 370 additionally includes a switch 376 configured to connect a second terminal 374b of the offset capacity Coff to a reference potential feed for the reference potential GND in the first phase and to connect the second terminal 374b of the offset capacity Coff to the charge summation node 232 in the second phase. The at least approximately sinusoidal voltage signal applied to the first terminal 374a of the offset capacity Coff by the voltage source is advantageously opposite in phase (that is phase-shifted by 180°) compared to the at least approximately sinusoidal voltage signal applied to the first terminal 244a of the capacity to be measured Csensor.

An amplitude of the sinusoidal voltage signal applied to the first terminal 374a of the offset capacity may equal an amplitude of the sinusoidal voltage signal applied to the first terminal 244a of the capacity to be measured Csensor or differ from said amplitude. Advantageously, a product of an amplitude of the sinusoidal signal applied to the first terminal 244a of the capacity to be measured and a mean capacity value of the capacity to be measured Csensor roughly equals (exemplarily with a tolerance of +/−10% or +/−20%) a product of an amplitude of the voltage signal applied to the first terminal 374a of the offset capacity Coff and the capacity value of the offset capacity Coff. This ensures that the charge provided by the offset charge providing circuit 370 at least approximately compensates the charge provided by the measuring charge providing circuit 240. This allows, for example, improving the sensitivity of the capacity measuring circuit.

It is essential that an essentially continuous sinusoidal voltage signal is applied here to the first terminal 374a or the first electrode of the offset capacity Coff, resulting in a favorable spurious behavior. The second terminal 374b of the offset capacity Coff is, however, nearly continuously (except for short phases in which the switch 376 is in a temporary intermediate state) at the reference potential GND. This means that there are no pulse-type signals applied to the offset capacity Coff, resulting in a favorable spurious behavior. The same also applies for the capacity to be measured Csensor.

4. Capacity Measuring Circuit in Accordance with FIGS. 4a, 4b and 4c

4.1. Capacity Measuring Circuit in Accordance with FIG. 4a

Figure 4A:
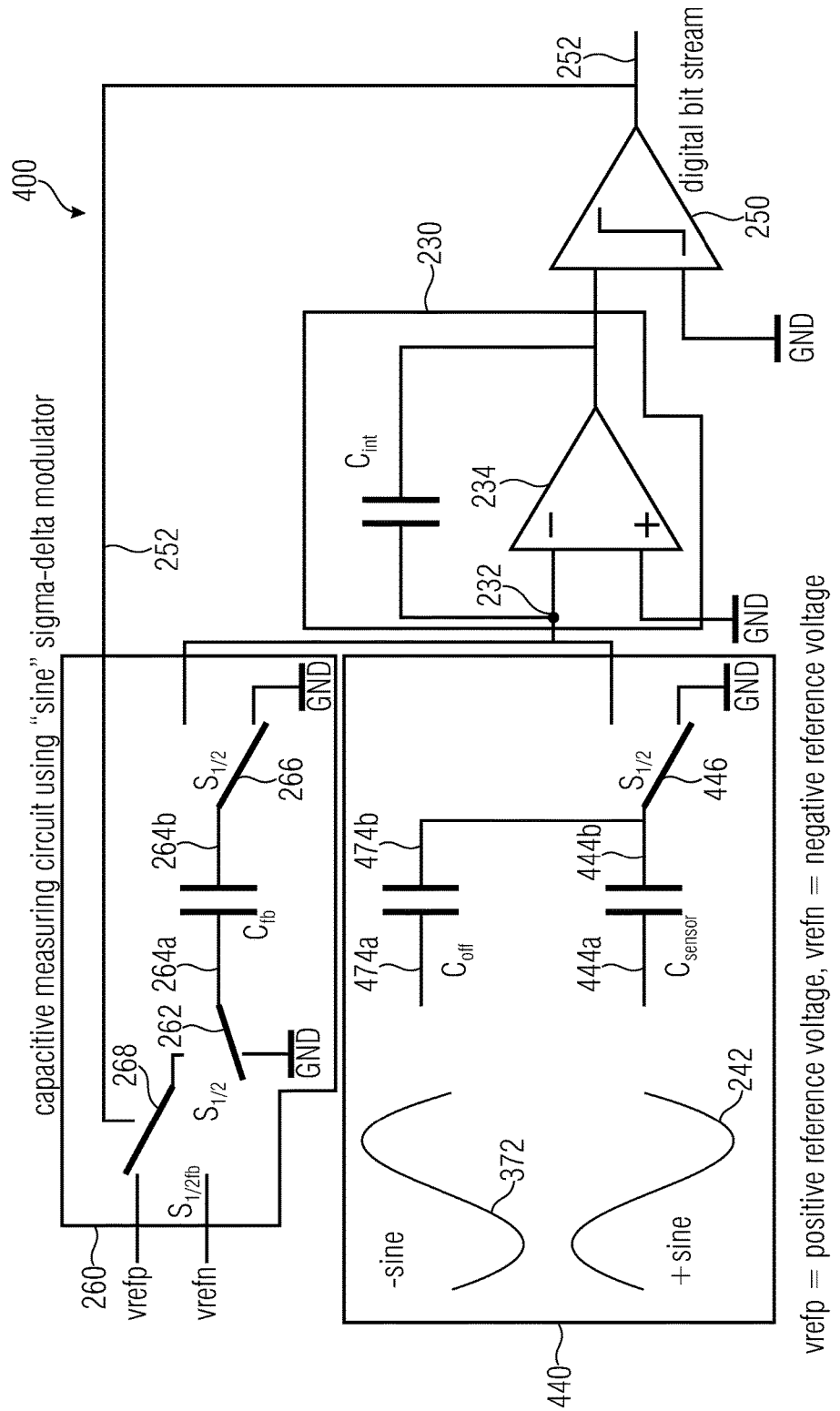
FIG. 4a shows a detailed circuit diagram of a capacity measuring circuit in accordance with another embodiment of the invention.

FIG. 4a shows a detailed circuit diagram of a capacity measuring circuit in accordance with another embodiment of the invention. The capacity measuring circuit is in its structure and mode of operation, very similar to the capacity measuring circuit 200 in accordance with FIG. 2 and the capacity measuring circuit 300 in accordance with FIG. 3. For this reason, equal or functionally equivalent characteristics here will be referred to by the same reference numerals and will not be discussed again. Rather, reference is made to the above expositions.

The capacity measuring circuit 400 in accordance with FIG. 4a differs from the capacity measuring circuit 200 in accordance with FIGS. 2 and 300 in accordance with FIG. 3 basically by a different and, as far as switching technology is concerned, particularly simple realization of the measuring charge provider 240 and the offset charge provider 270 and 370, respectively. The capacity measuring circuit 400 includes a combined measuring charge offset charge providing circuit 400 configured to feed the charge summation node 232, in the second phase of the sigma-delta modulator, a charge the quantity of which is determined by a difference between a quantity of the measuring charge and a quantity of the offset charge.

The combined measuring charge offset charge providing circuit 440 includes a capacity to be measured Csensor and an offset capacity Coff. The combined measuring charge offset charge providing circuit 440 includes a measuring voltage source configured to apply an (at least approximately) sinusoidal first voltage signal to a first terminal 444a of the capacity to be measured Csensor. The combined measuring charge offset charge providing circuit 440 additionally includes another voltage source configured to apply an (at least approximately) sinusoidal second voltage signal to a first terminal 474a of the offset capacity. The second voltage signal provided by the further voltage source, for example, is opposite in phase to the first voltage signal provided by the measuring voltage source. Amplitudes of the first voltage signal and the second voltage signal may, for example, be equal or different.

A second terminal 444b of the capacity to be measured Csensor and a second terminal 474b of the offset capacity Coff are coupled to each other directly or permanently (without any switch therebetween). The second terminal 444b of the capacity to be measured Csensor and the second terminal 474b of the offset capacity Coff, for example, may both be coupled via a switch 446 alternatively to a reference potential feed for the reference potential GND and the charge summation node 232.

Thus, during the first phase, the capacity to be measured Csensor is charged to a charge the quantity of which is determined by the voltage at the first terminal 444a of the capacity to be measured Csensor at the end of the first phase and by the capacity value of the capacity to be measured Csensor. Similarly, during the first phase, the offset capacity Coff is charged to a charge the quantity of which is determined by the voltage at the first terminal 474a of the offset capacity Coffset at the end of the first phase and by the capacity value of the offset capacity Coffset. Advantageously, a charge deposited on the capacity to be measured Csensor in the first phase is, as far as magnitude is concerned, approximately (such as, for example, within a tolerance range of 20%) equal to the charge deposited on the offset capacity Coff in the first phase, which may be achieved by a suitable selection of the capacity values of the capacity to be measured Csensor and of the offset capacity Coff and also by a suitable selection of the amplitude of the sinusoidal voltages applied to the terminals 444a, 474a.

In the second phase, both the charge stored on the capacity to be measured Csensor and the charge stored on the offset capacity Coff change, typically opposite in phase.

Thus, only a comparably small charge flows to the charge summation node 323 via the switch 446 in the second phase, wherein an amount of charge flowing via the switch 446 results from the difference between a change in the amount of charge stored on the capacity to be measured Csensor and a change in the amount of charge stored on the offset capacity. Thus, losses in the switch 446 are kept very small. Furthermore, the structure of the circuit 400 is particularly simple and the circuit 400 can do with particularly few elements.

4.2. Capacity Measuring Circuit in Accordance with FIG. 4b

Figure 4B:
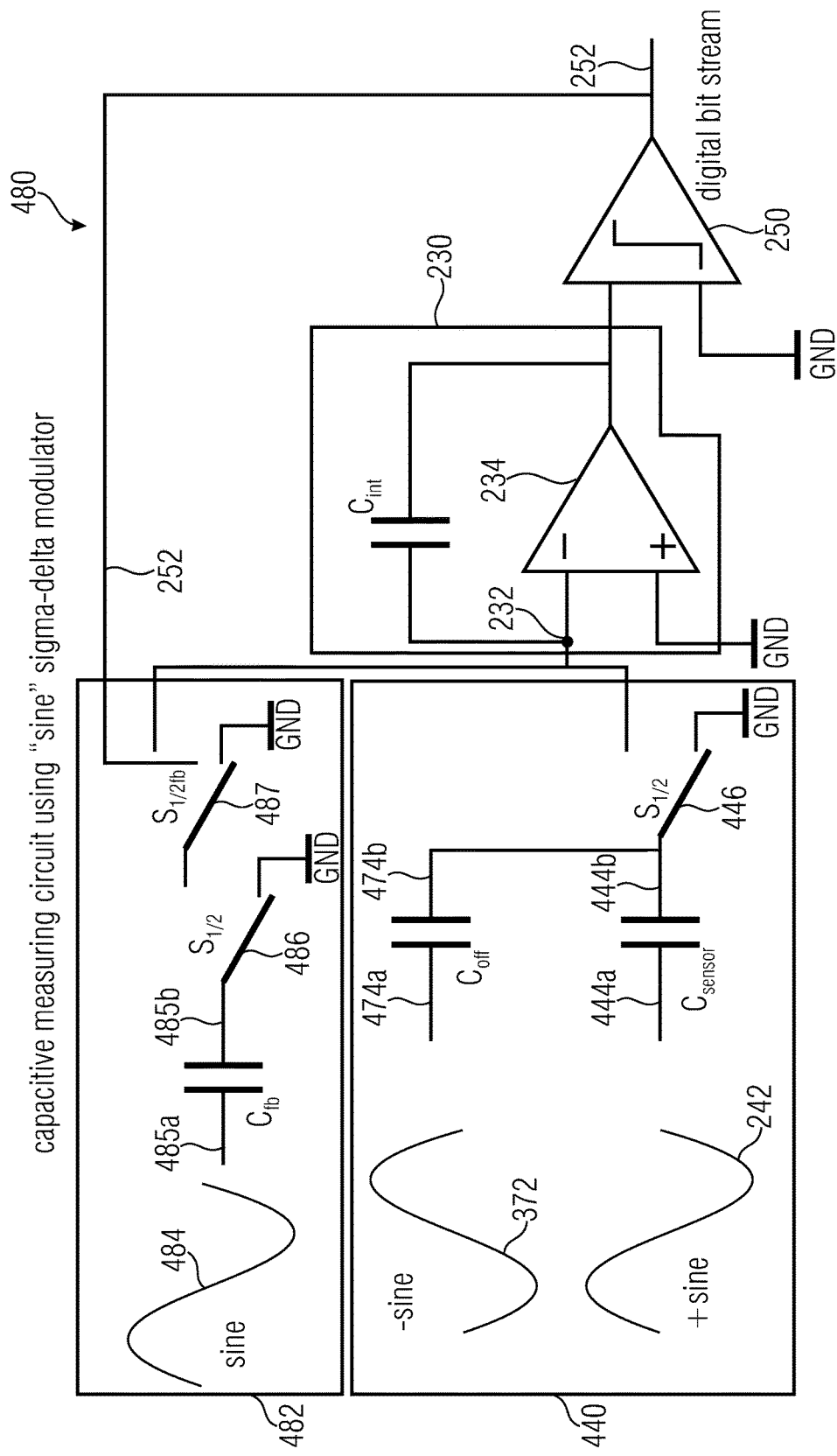
FIG. 4b shows a detailed circuit diagram of a capacity measuring circuit in accordance with another embodiment of the invention.

FIG. 4b shows a detailed circuit diagram of a capacity measuring circuit 480 in accordance with another embodiment of the invention. The capacity measuring circuit is in its structure and mode of operation very similar to the capacity measuring circuit 200 in accordance with FIG. 2, the capacity measuring circuit 300 in accordance with FIG. 3 and the capacity measuring circuit 400 in accordance with FIG. 4a. For this reason, same or functionally equivalent characteristics are referred to here by the same reference numerals and will not be discussed again. Rather, reference is made to the above expositions.

The capacity measuring circuit 480 in accordance with FIG. 4b differs from the capacity measuring circuit 400 in accordance with FIG. 4a in that the feedback charge provider 482 replaces the feedback charge provider 260.

The feedback charge provider 482 includes a voltage source providing an at least approximately sinusoidal voltage signal 484. The at least approximately sinusoidal voltage signal 484 is, for example, applied continuously or permanently to a first terminal 485a of the feedback capacity Cfb. The feedback charge provider 482 additionally includes a first switch 486 configured to couple a second terminal 485b of the feedback capacity Cfb to alternatively a reference potential feed for the reference potential GND and a central terminal of a second switch 487. The second switch 487 is configured to couple its central terminal, in dependence on the digital bit stream 252, alternatively to the reference potential feed for the reference potential GND and the charge summation node 232.

With regard to the functionality of the feedback charge provider 482, it may be stated that the feedback capacity Cfb, in the first phase, that is when the first switch 486 connects the second terminal 485b of the feedback capacity Cfb to the reference potential feed for the reference potential GND, is charged to a voltage which is determined by the value of the sinusoidal voltage signal 484 applied to the first terminal 485a of the feedback capacity Cfb at the end of the first phase. In the second phase, the charge stored on the feedback capacity Cfb is changed, the change in the amount of charge stored on the feedback capacity Cfb resulting between the end of the first phase and the end of the second phase resulting in feeding or draining a charge to and from the charge summation node 232, respectively, if the second terminal 485b of the feedback capacity Cfb is coupled to the charge summation node 232. What is achieved by selectively coupling the second terminal 485b of the feedback capacity Cfb to the charge summation node and by separating same from the charge summation mode in dependence on a current value of the digital bit stream 252, is that a certain amount of charge is selectively fed by the feedback capacity Cfb to the charge summation node 232 during the second phase. The quantity of this amount of charge is determined by a difference between the voltage applied to the first terminal 485a of the feedback capacity Cfb at the end of the first phase and the voltage applied to the first terminal 485a of the feedback capacity Cfb at the end of the second phase. The fact whether a charge is fed to the charge summation node 232 or not depends on whether the second terminal 485b of the feedback capacity Cfb is coupled to the charge summation node 232 or not.

It is to be pointed out that in the present embodiment it is not possible to provide a positive and a negative amount of charge to the charge summation node by the feedback charge providing circuit 482 in dependence on the value of the digital bit stream 252. Rather, in the embodiment in accordance with FIG. 4b, it is only possible to feed alternatively either a predetermined amount of charge or no charge to the charge summation node 232 by the feedback charge providing circuit 482. For this reason, it is recommended to configure the combined measuring charge offset charge providing circuit 440 such that same will either feed a positive amount of charge or a negative amount of charge to the charge summation node, irrespective of the quantity of the capacity to be measured Csensor. This may be achieved by a suitable selection of the amplitudes of the sinusoidal voltages or capacity values.

The capacity measuring circuit 480 in accordance with FIG. 4b is of advantage in that the feedback charge providing circuit may also be operated using a sinusoidal voltage signal. In many cases this results in a considerable reduction in spurious emission and thus in an improvement in electromagnetic compatibility. Furthermore, with regard to the precision of the capacity measurement, it is of advantage in many cases for the feedback charge to be generated based on a voltage signal which is largely similar to the voltage signals used for providing the measuring charge or offset charge. Errors which may exemplarily result due to temporal tolerances of the different phases may thus be kept small or even be eliminated completely.

In addition, it is to be pointed out that the feedback charge providing circuit 482 may also be employed in the other capacity measuring circuits described herein.

4.3. Capacity Measuring Circuit in Accordance with FIG. 4c

Figure 4C:
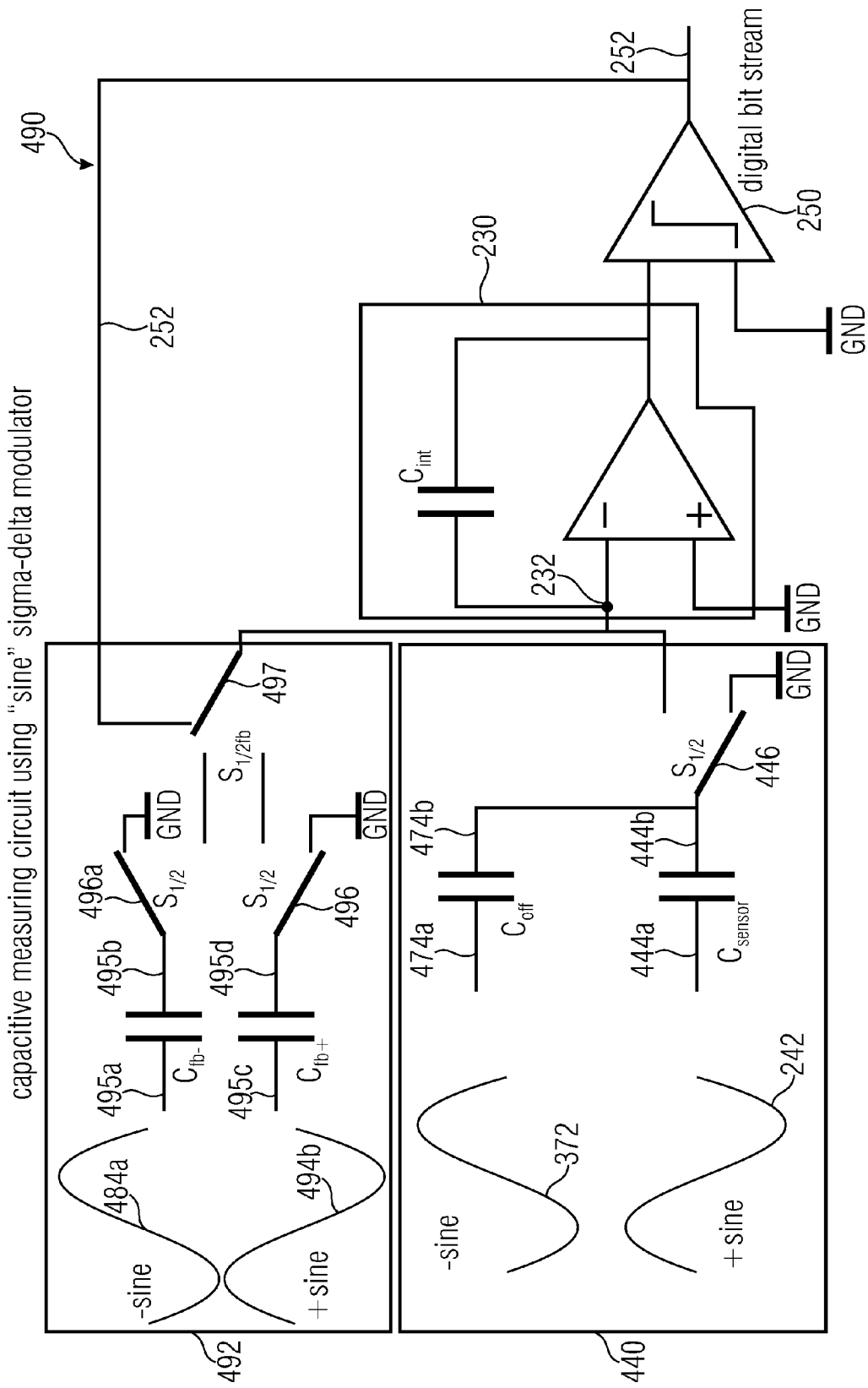
FIG. 4c shows a detailed circuit diagram of a capacity measuring circuit in accordance with another embodiment of the invention.

FIG. 4c shows a detailed circuit diagram of a capacity measuring circuit 490 in accordance with another embodiment of the invention. The capacity measuring circuit is, in its structure and mode of operation, very similar to the capacity measuring circuit 200 in accordance with FIG. 2, the capacity measuring circuit 300 in accordance with FIG. 3, the capacity measuring circuit 400 in accordance with FIG. 4a and the capacity measuring circuit 480 in accordance with FIG. 4b. For this reason, same or functionally equivalent characteristics here are referred to by the same reference numerals and will not be discussed again. Rather, reference is made to the above expositions.

The capacity measuring circuit 490 in accordance with FIG. 4c differs from the capacity measuring circuit 400 in accordance with FIG. 4a and the capacity measuring circuit 480 in accordance with FIG. 4b basically by the fact that, compared to the feedback charge providing circuits 360, 482, an altered feedback charge providing circuit 492 is used which feeds a first feedback amount of charge or a second feedback amount of charge to the charge summation node 232 in dependence on a current value of the digital bit stream 252, wherein the first feedback amount of charge and the second feedback amount of charge are typically of opposite signs.

The feedback charge providing circuit 492, for example, includes a voltage source which provides a first at least approximately sinusoidal signal 494a and a second at least approximately sinusoidal signal 494b. The first sinusoidal signal 494a and the second sinusoidal signal 494b may exemplarily be signals inverse to each other or phase-shifted to each other by 180°. The first sinusoidal signal 494a may additionally be identical to the sinusoidal signal 372 and the second sinusoidal signal 494b may exemplarily be identical to the sinusoidal signal 242. Mutually identical sinusoidal signals may additionally be provided using the same voltage source.

The feedback charge provider 492 is thus configured to apply the first sinusoidal signal 494a to a first terminal 495a of a first feedback capacity Cfb− and to apply the second sinusoidal signal 494b to a first terminal of a second feedback capacity Cfb+.

A second terminal 495b of the first feedback capacity Cfb− may be coupled to alternatively a reference potential feed for the reference potential GND and a first terminal of a third switch 497 via a first switch 496a. A second terminal 495b of the second feedback capacity Cfb+ may be coupled to alternatively a reference potential feed for the reference potential GND and a second terminal of the third switch 497 via a second switch 496b. Advantageously, the first switch 496a is driven such that the second terminal 494b of the first feedback capacity Cfb− is coupled to the reference potential feed for the reference potential GND in the first phase and to the first terminal of the third switch 497 in the second phase. Similarly, the second switch 496b is advantageously driven such that the second terminal 495b of the second feedback capacity Cfb+ is coupled to the reference potential feed for the reference potential GND in the first phase and is coupled to the second terminal of the third switch 497 in the second phase. The third switch 497 is additionally configured to couple alternatively its first terminal or its second terminal to the charge summation node 232, depending on a current value of the digital bit stream 252.

In summary, in the first phase, the second terminal 495b of the first feedback capacity Cfb− and the second terminal 495b of the second feedback capacity Cfb+ are coupled to the reference potential feed for the reference potential GND. However, in the second phase, alternatively the second terminal 495b of the first feedback capacity Cfb− or the second terminal 495d of the second feedback capacity Cfb+ is coupled to the charge summation node 232, depending on the current value of the digital bit stream 252.

This results in applying to the first feedback capacity Cfb−, during the first phase, an amount of charge determined by a voltage applied to the first terminal 495a of the first feedback capacity Cfb− at the end of the first phase. Similarly, a charge the quantity of which is determined by a voltage applied to the first terminal 495c of the second feedback capacity Cfb+ at the end of the first phase is deposited onto the second feedback capacity Cfb+ during the first phase. During the second phase, the amount of charge on at least that one of the feedback capacities Cfb−, Cfb+ the second terminal 495b, 495d of which is coupled to the charge summation node 232 is changed. The amount of charge stored on the feedback capacity coupled to the charge summation node 232 at the end of the second phase is determined by the voltage applied to the first terminal 495a and 495c of the corresponding capacity at the end of the second phase such that all in all a change in the amount of charge stored on the corresponding feedback capacity during the second phase is determined by a change in the voltage at the first terminal of the corresponding capacity between the end of the first phase and the end of the second phase. The result is a change in the amount of charge stored on the first feedback capacity Cfb− and the second feedback capacity Cfb+ between the end of the first phase and the end of the second phase. This change in the amount of charge stored results in, during the second phase, the charge summation node being fed an amount of charge by that feedback capacity Cfb− and Cfb+ the second terminal 495b, 495d of which is coupled to the charge summation node 232 during the second phase. Typically, the amount of charge fed to the charge summation node 232 during the second phase differs in sign, depending on which of the two feedback capacities Cfb− and Cfb+ is coupled to the charge summation node in the second phase.

The result obtained is that a positive amount of charge or a negative amount of charge is fed to the charge summation node 232 by the feedback charge providing circuit 492, depending on the current value of the digital bit stream 252. Furthermore, a particularly good electromagnetic compatibility is typically achieved by the fact that respective sinusoidal voltage signals are applied to the first terminal 495a of the first feedback capacity and the first terminal 495c of the second feedback capacity. Additionally, a particularly good presicion of the capacity measuring circuit is achieved by the fact that the signal shape of the voltage signal applied to the first terminal 495a of the first feedback capacity essentially corresponds to a signal shape of the sinusoidal voltage signal 372 and that a signal shape of the voltage signal applied to the first terminal 495c of the second feedback capacity basically corresponds to a signal shape of the voltage signal 242.

5. Mode of Operation of the Circuits in Accordance with FIGS. 2, 3 and 4a, 4b and 4c Details with regard to the mode of operation and to the particular advantages of the circuits in accordance with FIGS. 2, 3, 4a, 4b and 4c will be described below.

It is pointed out in this regard that the capacity measuring circuit 200 in accordance with FIG. 2 may be considered to be a capacity measuring circuit including a "standard" sigma-delta modulator. The capacity measuring circuit 300 in accordance with FIG. 3, however, may be considered to be a capacitive measuring circuit using a "sine" sigma-delta modulator. The capacity measuring circuit 400 in accordance with FIG. 4a, the capacity measuring circuit 480 in accordance with FIG. 4b and the capacity measuring circuit 490 in accordance with FIG. 4c may also be considered to be capacitive measuring circuits using a "sine" sigma-delta modulator.

The clock scheme of the capacity measuring circuits 200, 300, 400, 480, 490 will be described below with reference to FIGS. 5, 6a and 6b.

Figure 5:
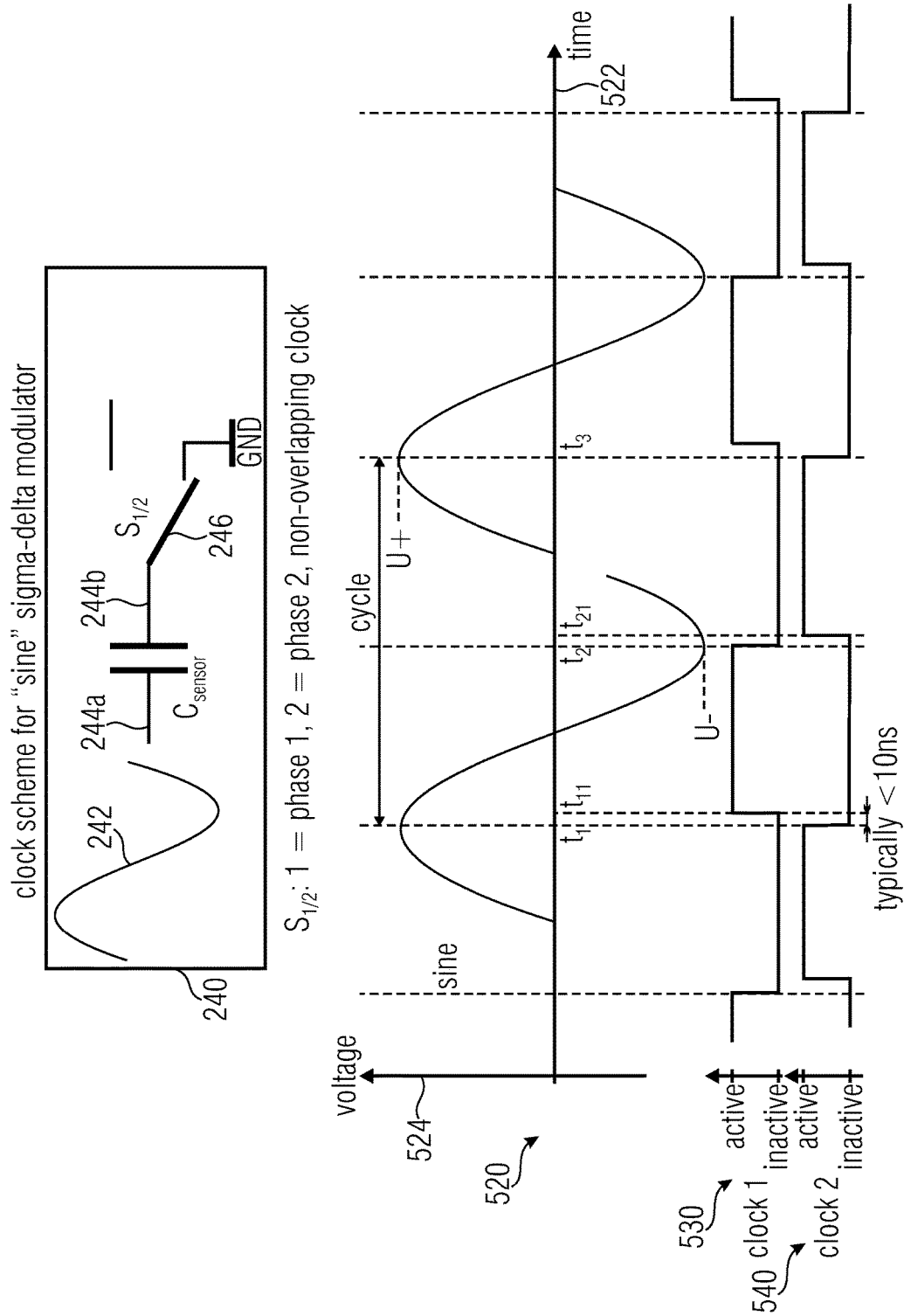
FIG. 5 shows a clock scheme for a sigma-delta modulator including sinusoidal excitation.

FIG. 5 shows a circuit diagram of the measuring charge providing circuit 240 and a graphical illustration of the sine voltage applied to the first terminal 244a of the capacity to be measured Csensor and the switching states of the switch 246. A schematic illustration 520 describes the course of the sinusoidal voltage applied to the first terminal 244a of the capacity to be measured Csensor over time, an abscissa 522 describing time and an ordinate 524 describing the voltage value. Cycles of the delta-sigma modulator are typically temporally synchronized with the sinusoidal voltage signal at the first terminal 244a of the capacity to be measured Csensor. Exemplarily, it is assumed here that a first cycle of the delta-sigma modulator starts at a time t1 when the voltage signal at the terminal 244a of the capacity to be measured Csensor exhibits a maximum, and ends at a time t3 when the voltage at the first terminal 244a exhibits its next maximum.

It is assumed here that two offset clock signals (clock 1, clock 2) which control the different phases or operating phases of the delta-sigma modulator are provided. A temporal course of a first clock signal "clock 1" is shown at a reference numeral 530 and a temporal course of a second clock signal "clock 2" is shown at a reference numeral 540. The first clock signal (clock 1), for example, is enabled at a time t11 shortly after the time t1 when the sinusoidal voltage signal at the terminal 244a of the capacity to be measured Csensor exhibits its maximum. The first clock signal is, for example, disabled at the time t2 when the sinusoidal voltage signal at the first terminal 244a of the capacity to be measured Csensor exhibits its minimum. The first clock signal then remains inactive during the remaining cycle, that is between the times t2 and t3.

The second clock signal (clock 2), however, becomes inactive at the time t1. The second clock signal (clock 2) is enabled at the time t21 shortly after the time t2 and then remains active until the time t3.

Thus, the first clock signal (clock 1) and the second clock signal (clock 2) are non-overlapping, that is they will at no time be both active.

Additionally, it is to be pointed out that a period duration of the sinusoidal voltage signal at the terminal 244a of the capacity to be measured Csensor is typically in a range between 100 nanoseconds and 5 microseconds, corresponding to a frequency between 200 kHz and 10 MHz. A time interval between the times t1 and t11 typically is less or even considerably less than 1/20 of a period duration of the corresponding voltage signal. The same applies to a time interval between the times t2 and t21. In addition, the time interval between the times t1 and t11 and the time interval between the times t2 and t21 are typically less than 10 nanoseconds such that the periods of time when both the first clock signal and the second clock signal are inactive are very short.

It is also to be pointed out that the first phase of the sigma-delta modulator is defined by the first clock signal being active. The first phase of the sigma-delta modulator thus extends from the time t1 1 to the time t2. The second phase of the sigma-delta modulator is defined by the second clock signal being active. The second phase of the sigma-delta modulator thus extends from the time t21 to the time t3.

When having a look at the mode of operation of the measuring charge providing circuit 240, it becomes clear that, at the end of the first phase, a voltage U−which exemplarily corresponds to the (typically negative) minimum value of the sinusoidal voltage signal provided by the measuring voltage source is applied to the first terminal 244a of the capacity to be measured Csensor. During the first phase, the capacity to be measured Csensor is separated from the charge summation node 232 by the switch 246.

However, during the second phase, the capacity to be measured Csensor is recharged such that a voltage U+ is applied to the first terminal 244a of the capacity to be measured Csensor at the end of the second phase, the voltage U+ corresponding to the (typically positive) maximum value of the sinusoidal voltage signal provided by the measuring voltage source. The second terminal 244b of the capacity to be measured Csensor, however, is kept at the reference potential GND by the operational amplifier 234 of the charge integrator 230. This results in a voltage course between the terminals 244a, 244b or electrodes of the capacity to be measured Csensor to be basically sinusoidal and corresponding current flows in the respective feed lines coupled to the terminals 244a, 244b or the electrodes of the capacity to be measured to be also approximately sinusoidal. This results in a considerable reduction in disturbances.

It will be described below referring to FIG. 6 how the switched-capacitor technology used for realizing the feedback charge provider 260 and also used in the capacity measuring circuit 200 for realizing the offset charge provider 270 works.

Figure 6A:
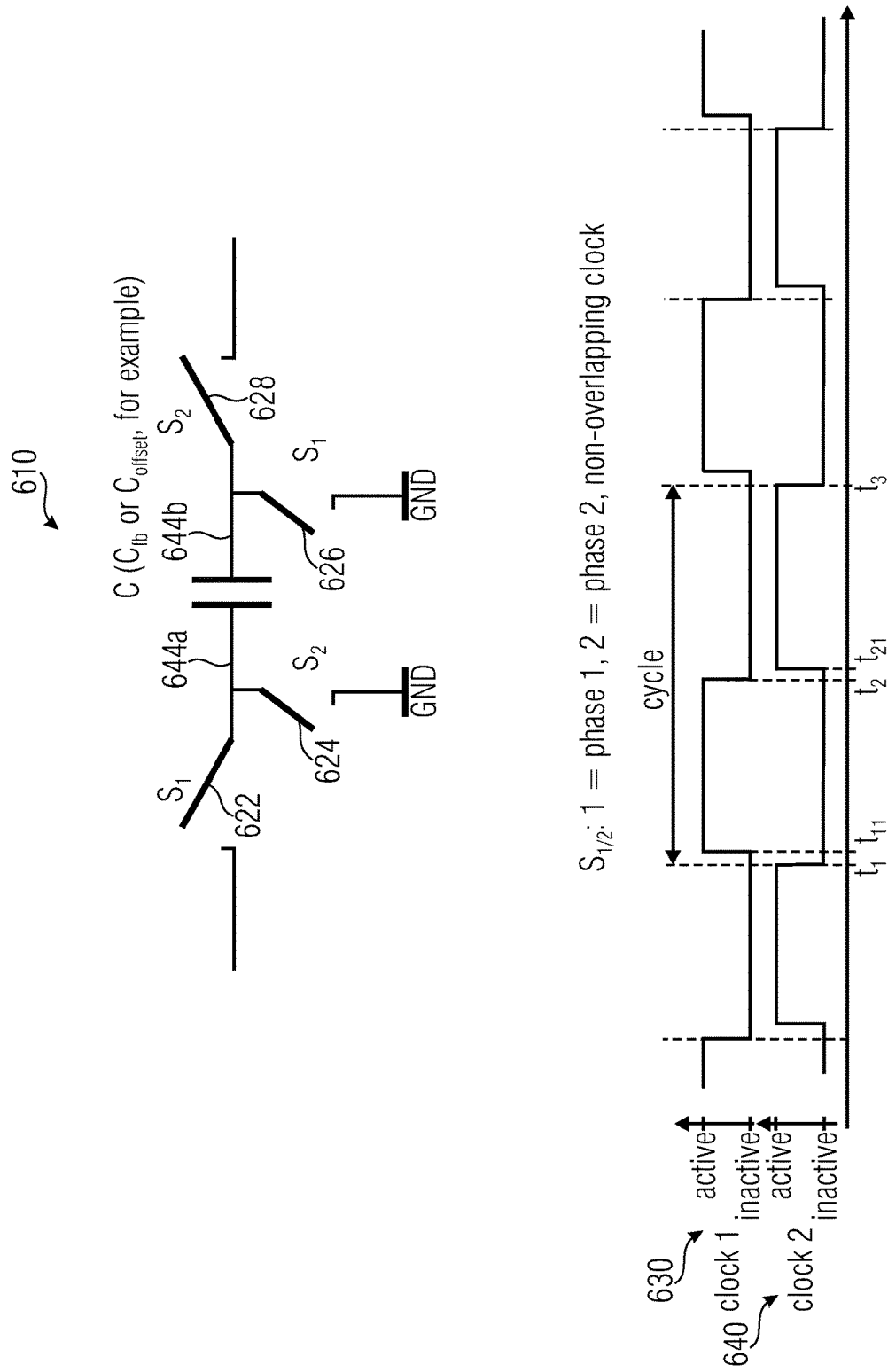
FIG. 6a shows a basic circuit diagram of a switched-capacitor technology.

FIG. 6a shows a basic circuit of the so-called switched-capacitor technology at a reference numeral 610. The circuit assembly 610 may exemplarily take the function of the feedback capacity Cfb in connection with the switches 262, 266.

A graphical illustration of the states of the first clock signal is shown at a reference numeral 630 and a graphic illustration of the states of the second clock signal is shown at a reference numeral 640. The definition of the different phases within a cycle corresponds to the definition discussed already referring to FIG. 5. The circuit assembly 610 includes a first input-side switch 622 arranged to connect a first terminal 644a of the capacity C to a voltage source (not shown in FIG. 6a) in the first phase. The circuit assembly 610 additionally includes a second input-side switch 624 configured to connect the first terminal 644a of the capacity C to a feed for the reference potential GND in the second phase. The circuit assembly 610 additionally includes a first output-side switch 626 configured to connect a second terminal 644b of the capacity C to the feed for the reference potential GND in the first phase. In addition, the circuit assembly 610 includes a second output-side switch 628 configured to connect the second terminal 644b of the capacity C to another circuit node such as, for example, the charge summation node 232.

The first input-side switch 622 and the first output-side switch 626, for example, are driven by the first clock signal (clock 1) and are thus closed in the first phase and otherwise opened. The second input-side switch 624 and the second output-side switch 628, for example, are driven by the second clock signal (clock 2) and are thus closed in the second phase and otherwise opened. Thus, the capacity C is charged via the input-side voltage source in the first phase and is discharged in the second phase via the output-side switch 628 to another node such as, for example, the charge summation node 232.

Thus, the capacity C is alternatingly charged and discharged, the charging phase (phase 1) and the discharging phase (phase 2) being non-overlapping in time.

As an alternative to the circuit assembly 610, temporal driving of the input-side switches 622, 624 may also be exchanged as is, for example, the case in the feedback charge provider 260. While the capacity C is charged here, the capacity in this case is connected between the input-side voltage source not shown in FIG. 6a and the further output-side node not shown in FIG. 6a (such as, for example, the charge summation node 232) such that when charging the capacity C, a charge is transferred to the output-side node (such as, for example, charge summation node 232). In this case, the capacity C is discharged via the then both closed switches 624, 626.

Both variations with regard to driving the switches 622, 624, 626 and 628 are feasible and make sense in connection with the capacity measuring circuit described above.

Figure 6B:
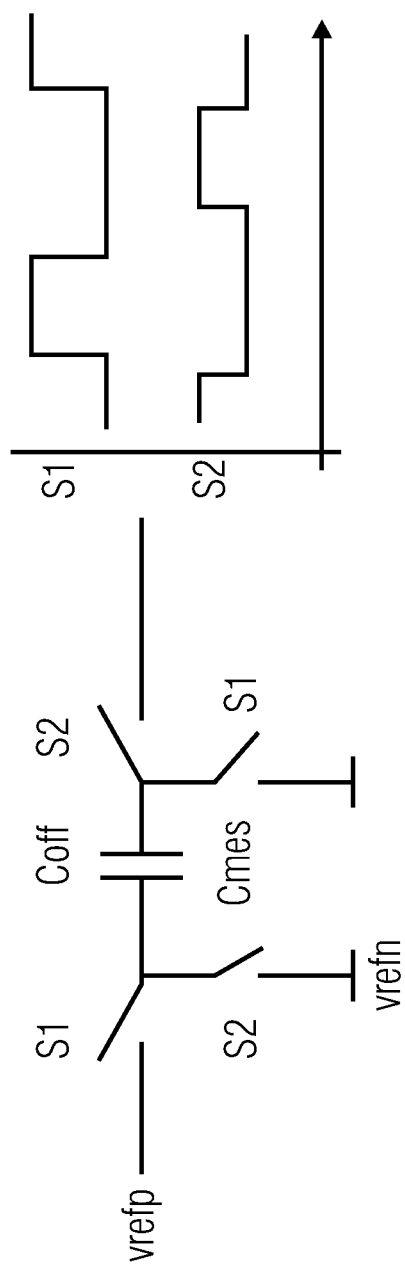
FIG. 6b shows another basic circuit diagram of the switched-capacitor technology.

FIG. 6b shows another illustration of the principle of switched-capacitor technology.

With regard to the basic mode of operation of the capacity measuring circuits 200, 300, 400 in accordance with FIGS. 2, 3, 4a, 4b and 4c, it may be stated that the following connection applies, when defining the signs of the charges suitably, between a charge Qint on the integration capacity Cint, a charge Qmess transferred from the sensor capacity Csensor to the integration capacity Cint, the offset charge Qoff transferred from the offset capacity Coffset to the integration capacity Cint and the feedback capacity Cfb transferred from the feedback capacity Cfb to the integration capacity Cint:

$$Qint=Qmess-(Qoff+Qfb).$$

At the same time (or, alternatively, in a certain sequence), the charge of the measuring capacity, the offset capacity and the feedback capacity is deposited on the integration capacity.

In an embodiment, a capacity value Cfb of the feedback capacity is greater than or equaling a difference between the capacity values of the capacity to be measured (Cmess) and the offset capacity (Coff):

$$Cfb \geq (Cmess-Coff).$$

Furthermore, in one embodiment, the following applies:

$$Cmess > Cfb.$$

In an embodiment, the following applies:

$$Cmess = 2*Cfb.$$

The capacity measuring circuits 200, 300, 400 in accordance with FIGS. 2, 3, 4a, 4b and 4c advantageously operate at non-overlapping two-phase clocks of constant frequency. In the first clock phase, the switches 1 are closed and the capacities Cmess (or Csensor), Coff and Cfb are charged. In the second clock phase, the switches 2 are closed and the charges of all three capacities are transferred to the integration capacity Cint.

FIG. 6b shows a possible switch variation including the respective clock diagram. However, there are many other circuit variations for the switched-capacitor technique.

Generally, it is also to be mentioned that in circuit assemblies in which several sinusoidal voltages which are applied to different inputs of the modulator are used, amplitudes of the sinusoidal voltages may be selected to be different. This is, for example, true for the circuit assembly 300 in accordance with FIG. 3, wherein the amplitudes of the sinusoidal voltages 242, 372 applied to the capacitor terminals 244a, 374a may be selected to be different. This is, for example, also true for the circuit assembly 400 in accordance with FIG. 4a, wherein the amplitudes of the sinusoidal voltages 242, 372 applied to the capacitor terminals 444a, 474a may be selected to be different and also for the circuit assembly 480 in accordance with FIG. 4b, wherein the amplitudes of the sinusoidal voltages 242, 372, 484 applied to the capacitor terminals 444a, 474a, 485a may be selected to be different, and also for the circuit assembly 490 in accordance with FIG. 4c wherein the amplitudes of the sinusoidal voltages 242, 372, 494a, 494b applied to the capacitor terminals 444a, 474a, 495a, 495c may be selected to be different. The respective capacities may also be selected to be different.

A partial aspect of the circuit assembly described here also entails that amplitudes of the sine voltages at the different inputs of the modulator (such as, for example, in the circuit assembly in accordance with FIG. 4a) need not exhibit the same amplitude but may also be used so as to set the ratio of the measuring charge, the offset charge and the feedback charge.

Furthermore, it is to be pointed out that in the present description of circuit assemblies, a single-ended realization or design is described and illustrated. However, in some cases, implementing a differential design may in some cases be of advantage. In other words, all the embodiments described here may alternatively also be realized differentially.

Transferring the single-ended circuit technology to a differential circuit technology is known to those skilled in the art.

6. Method in Accordance with FIG. 7

Figure 7:
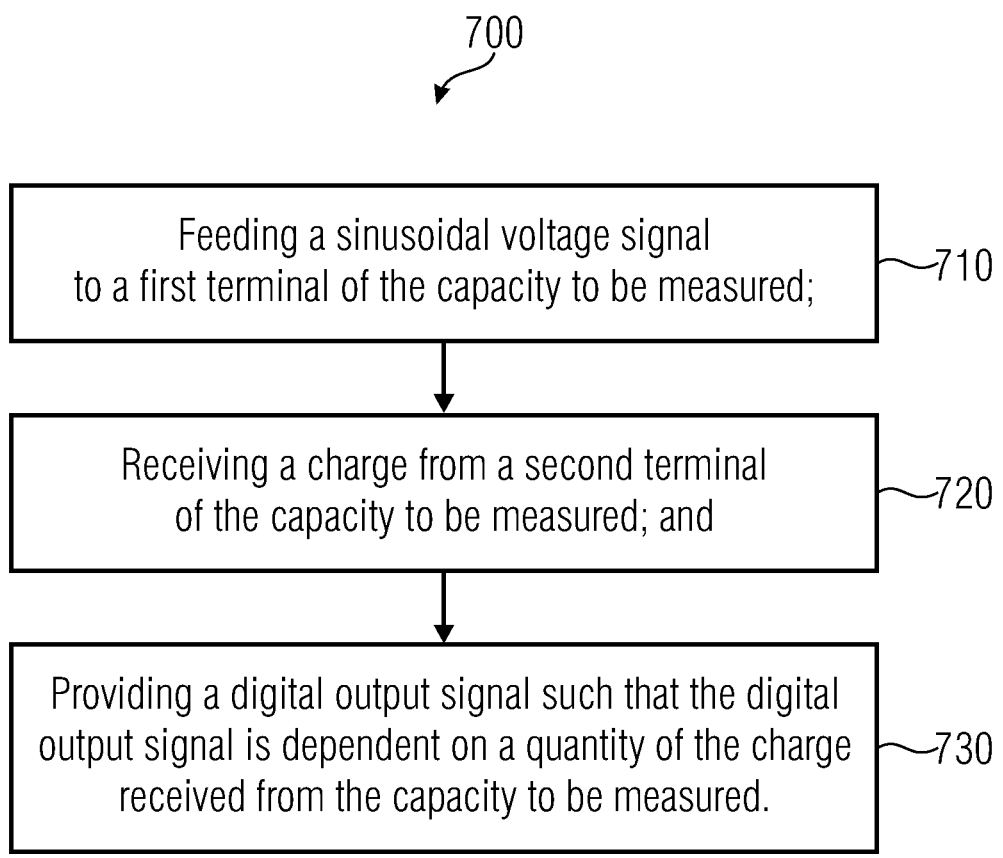
FIG. 7 shows a flow chart of a method for measuring a capacity in accordance with an embodiment of the invention.

FIG. 7 shows a flow chart of a method for determining a capacity value of a capacity to be measured in accordance with an embodiment of the present invention. The method 700 includes, in step 710, feeding a sinusoidal voltage signal to a first terminal of the capacity to be measured. In addition, the method 700 includes, in a second step 720, receiving a charge from a second terminal of the capacity to be measured. The method 700 additionally includes, in step 730, providing a digital output signal such that the digital output signal is dependent on a quantity of the charge received from the capacity to be measured.

The method 700 may be supplemented by all the features and functionalities as described herein with regard to the inventive device.

7. Conclusions

The inventive concept will be summarized below briefly and some important aspects will be dealt with.

Embodiments of the invention relate to using a delta-sigma modulator for measuring capacities at narrow-band spurious emissions. This allows shifting potential spurious frequencies to regions which, depending on the application, have less critical effects on the surroundings. In addition, there is a way of suppressing these narrow frequency bands more easily by means of external connections, which has not been possible with broad-band coupling as has been applied in delta-sigma methods used up to now.

Figure 8:
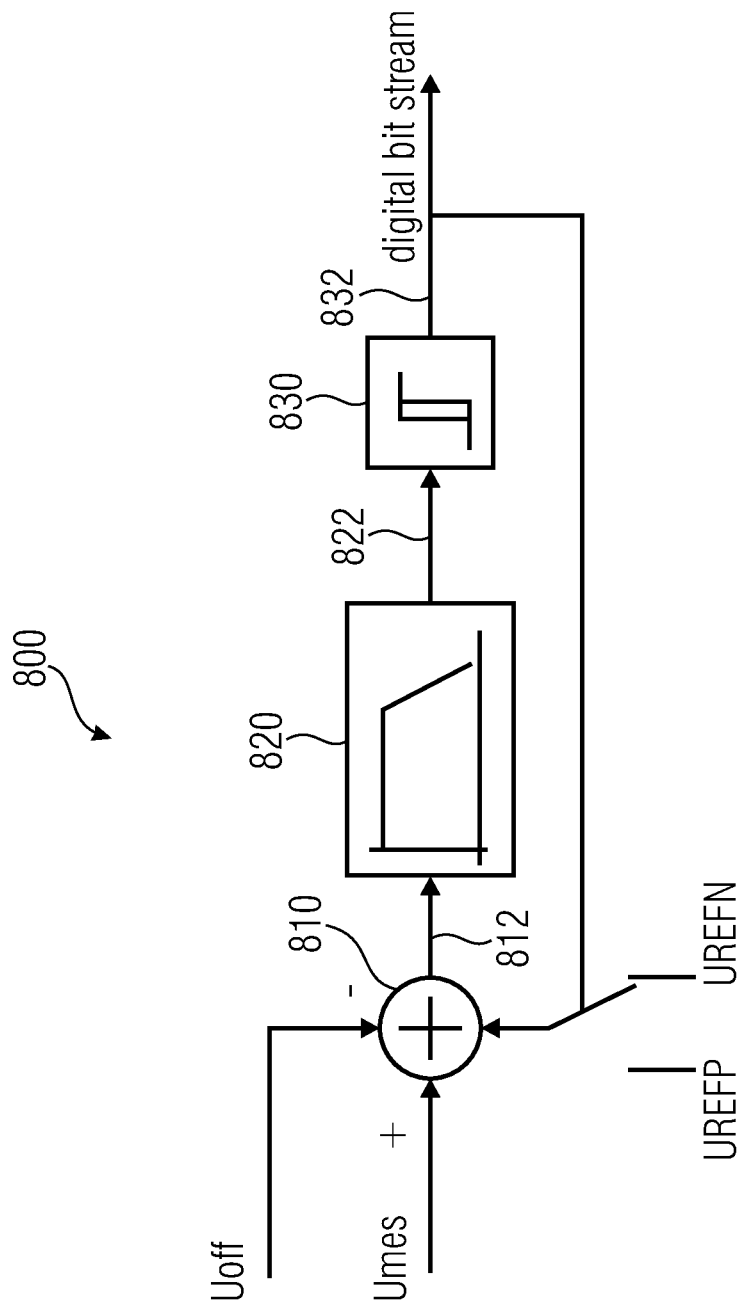
FIG. 8 shows a schematic illustration of the principle of a delta-sigma modulator.

The basic function of the delta-sigma modulator is illustrated in FIG. 8. In other words, FIG. 8 shows a schematic illustration of the principle of the delta-sigma modulator.

Figure 9:
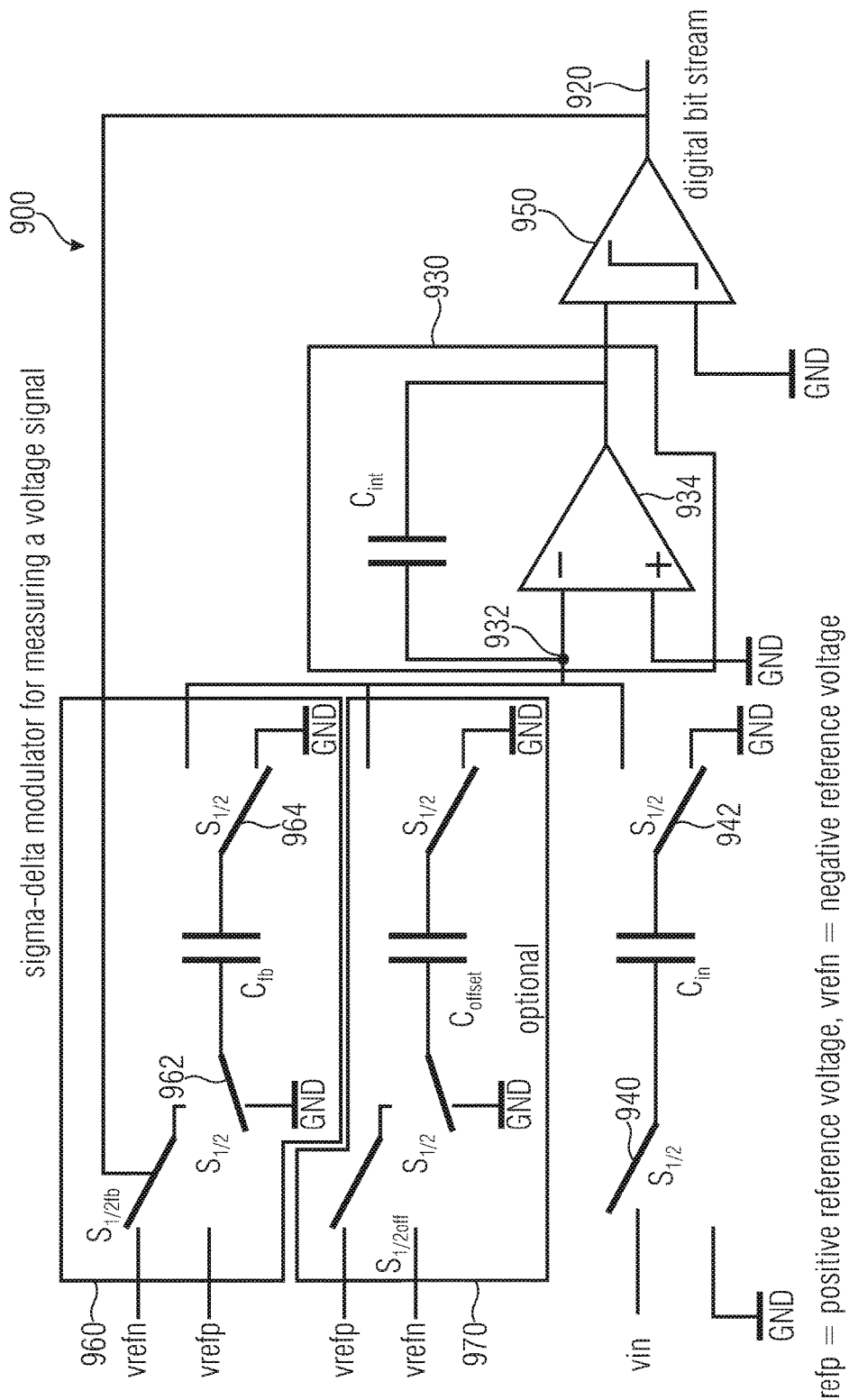
FIG. 9 shows a detailed circuit diagram of a conventional sigma-delta modulator for measuring a voltage signal.
Figure 10:
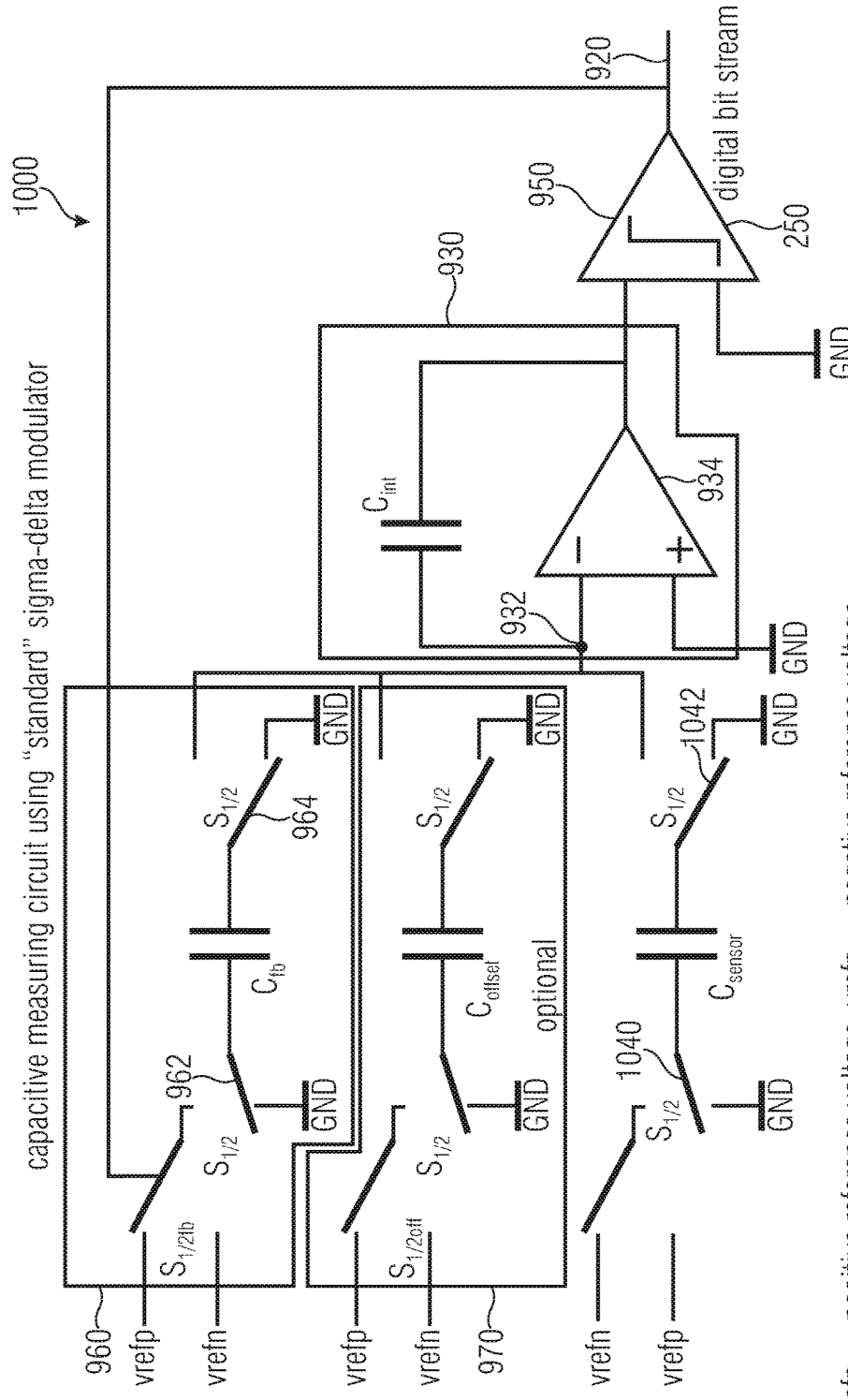
FIG. 10 shows a detailed circuit diagram of a conventional capacity measuring circuit using a "standard" sigma-delta modulator.

FIGS. 9 and 10 show the connections when using a conventional delta-sigma modulator for the capacity measurement. The capacity Cin at the input of the modulator is charged from the input voltage to be measured in the first clock phase. In the second clock phase, the charge is placed on the integration capacity Cint and processed in accordance with the convention delta-sigma principle.

Embodiments in accordance with the invention provide a system in which the input voltage vin (as is exemplarily used in the circuit assemblies 900 and 1000 in accordance with FIGS. 9 and 10, respectively) is replaced by a frequency-stable and amplitude-stable sine voltage and the capacity Cin in the input branch is replaced by the measuring capacity Csensor. The respective circuit assemblies, for example, are shown in FIGS. 1, 2, 3, 4a, 4b and 4c.

A sine signal (such as, for example, an—at least approximately—sinusoidal voltage signal) instead of (as in prior publications) a square-wave signal is placed on the sensor capacity (such as, for example, on the first terminal 244a of the capacity to be measured Csensor), thus avoiding broad-band spurious emission.

The capacity Csensor is at the same time the input capacity (corresponding to Cin in the circuits 900, 1000 in accordance with FIGS. 9 and 10) of the delta-sigma modulator.

Generally, the modulator operates at a fixed operating frequency which, however, may (optionally) be varied from measurement to measurement.

In embodiments in accordance with the invention, the measuring capacity Csensor is charged successively from a defined sine voltage via the switches S1/x. The charge is then, via the switches Sx/2, placed on the integration capacities (or integration capacity) of the modulator (such as, for example, Cint), integrated and evaluated.

The switches (such as, for example, the switches 246, 262, 266, 272, 276) are operated using a non-overlapping two-phase clock of fixed frequency. The two-phase clock operates synchronously with the sine voltage "+ sine" applied to the input (such as, for example, the first terminal 244a) of the sensor capacity.

The output bit stream (such as, for example, the digital bit stream 252) is integrated or fed to a digital filter so as to acquire, for example, information on a capacity value of the capacity.

The optional offset capacity Coffset in some embodiments comprises a sine voltage shifted by 180° relative to the input sine signal (such as, for example, the sinusoidal voltage signal applied to the first terminal 244a of the sensor capacity Csensor) or else a fixed voltage (such as, for example, vrefp or vrefn).

The measuring range of the modulator is determined by the ratio of the capacity Cfb in the feedback branch to the input capacity Cin and by the ratio of the sine signal amplitude (exemplarily the sinusoidal voltage signal applied to the first terminal 248a of the capacity to be measured Csensor) to the reference voltage (vrefp−vrefn) in the feedback branch.

Principally, the feedback branch may in some embodiments also be supplied with a sine voltage.

When a defined charge is drained from the integration charge, a fixed offset portion may be drained from the measuring capacity (Csensor). This may be realized by an offset capacity Coff in parallel to the sensor capacity which is, for example, charged from a sine voltage shifted by 180° (shifted by 180° with regard to the sine voltage applied to the first terminal 244a of the capacity to be measured Csensor), or a (fixed or switchable) reference voltage which is comparable to the feedback branch.

The sensitivity of the measurement, the intensity of spurious emissions and the offset charge referenced to the sensor charge may, among other things, be influenced by varying the amplitude of the sine voltages.

In some embodiments in accordance with the present invention, the following applies, at least approximately:

$$Csensor=Cfb+Coffset.$$

The following definitions apply here:
Cfb: capacity in the feedback branch;
Coffset: static portion of the measuring capacity; and
Csensor: dynamic portions of the measuring capacity.

There are different ways of realizing the offset capacity, like, for example:
  integrated silicon capacity;
  external offset capacity Coffset; or
  integrated or external capacity digital-to-analog converter.

In contrast to standard sigma-delta modulators, the clock in the method presented here is to be synchronous to the sine signal (such as, for example, the sinusoidal voltage signal applied to the first terminal 244a of the capacity to be measured Csensor). In this regard, reference here is made to FIG. 5 and corresponding explanations. Switching the individual phases (such as, for example, phase 1 and phase 2) of the two clocks (clock 1 and clock 2) is advantageously done at a maximum or minimum of the sine signal. This means that there will (at least during a capacity measurement which typically includes several cycles of the sigma-delta converter) be a constant sine frequency (or a stationary sinusoidal voltage signal) on the one plate or electrode of the measuring capacity (such as, for example, on that plate or electrode which is connected to the first terminal 244a) and a constant direct voltage or DC voltage on the second plate or electrode (such as, for example, on the plate or electrode, connected to the second terminal 244b, of the capacity to be measured Csensor). The sine frequency may in some embodiments be varied from measurement to measurement but may also remain unchanged in between different measurements.

When it is desirable to minimize spurious emission of the offset capacity as well, same may be operated in correspondence with the embodiments in accordance with FIGS. 3 and 4, for example using a sine voltage phase-shifted by 180° (phase-shifted with regard to the sine voltage applied to the first terminal of the capacity to be measured). This causes only narrow-band emission on the offset capacity as well.

When a circuit in accordance with FIGS. 4a, 4b or 4c is used, the input voltage (applied to the first terminal 274a of the offset capacity Coff) should be a sine voltage phase-shifted by 180° to the input signal (of the voltage applied to the first terminal 444a of the capacity to be measured Csensor). A sine current (such as, for example, for providing an offset charge) may also be used as an alternative to the sine voltage. All the remaining circuit components remain the same.

Synchronizing sine voltage and clock can be achieved in different ways. Taking the example of a sine voltage, the respective clock may be produced by zero crossing and/or min/max voltage detection. Another implementation uses an n-fold higher oscillator clock and generates, through digital sampling points and a digital-to-analog converter, a sinusoidal signal shape which can be smoothed using a low pass filter. These and similar methods for synchronizing a sine voltage using a digital clock are generally known.

What follows is a discussion of an evaluation of the inventive circuit assembly. Essential advantages of embodiments in accordance with the invention will be described at first.

A considerable advantage of embodiments in accordance with the present invention is the combination of advantages of capacitive delta-sigma modulators and narrow-band sensor excitations as is also used in synchronous demodulators. The spurious emission is limited to an adjustable narrow frequency band. This is why, with a corresponding frequency selection, a sensor excitation signal of high amplitude may be applied. This increases the effective distance when, for example, using the method for approximation sensors, distance sensors and other sensors.

The inventive concept thus represents an advantageous alternative to using synchronous demodulators. In contrast to synchronous demodulators which provide an analog voltage which then has to be transformed to a digital signal using another circuit block, as output signal, a delta-sigma modulator directly provides a digital output signal, such as, for example, in the form of a digital bit stream 252, entailing little circuit expenditure.

Some fields in which the inventive concept can be applied will be described below.

The inventive capacity measuring circuit or an inventive sensor system or an inventive method is particularly suitable in all capacitive measuring systems in which the sensor does not represent a shielded system but achieves its sensor effect by means of the field emitted:
  protection from getting trapped in automatically closing windows, doors and other elements;
  monitoring robots or other movable parts for avoiding collisions with persons or objects;
  methods for measuring material parameters, thickness, consistency, water content, etc. in open measuring systems;
  moisture and rain sensors; and
  touch-sensitive operating and input fields.

Embodiments in accordance with the invention may be employed in connection with all those applications described herein, also in the introductory part.

In summary, it may be stated that embodiments in accordance with the invention relate to measuring capacities using delta-sigma modulators of narrow-band spurious emission. While conventional capacities measuring methods using delta-sigma modulators, also known under the term "capacitive-to-digital converters" (CDC), usually operate using square-wave or quasi-square-wave signals on the capacity to be measured, in embodiments in accordance with the invention, a sinusoidal voltage signal is applied to the capacity to be measured. It has been found out that the presence of square-wave or quasi-square-wave signals on the capacity to be measured results in considerable spurious emission problems in open sensor systems. The inventive concept or method, in contrast, operates using a sine signal on the sensor capacity and thus limits spurious emissions to a defined narrow frequency band.

Embodiments in accordance with the invention may exemplarily be implemented as integrated circuits. However, they may as well be realized using discrete elements.

Implementation may be both asymmetrical, as described above in detail, and symmetrical.

Embodiments in accordance with the present invention may be employed universally in the field of capacity measuring technology. Embodiments in accordance with the invention thus represent a considerable improvement of the concept in accordance with DE 10 2005 038 875 A1.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A capacity measuring circuit comprising:
a measuring voltage source configured to feed a sinusoidal voltage signal to a first terminal of a capacity to be measured so as to cause a temporal change in a charge stored on the capacity to be measured; and
a delta-sigma modulator, the delta-sigma modulator being configured to receive a charge from a second terminal of the capacity to be measured and to provide a digital output signal which depends on a quantity of the charge received from the capacity to be measured; wherein the capacity measuring circuit is configured to bring the capacity to be measured to a first charge state in a first phase using the sinusoidal voltage signal and to bring the capacity to be measured to a second charge state in a second phase using the sinusoidal voltage signal; and
wherein the delta-sigma modulator is configured to receive an amount of charge equaling a difference between an amount of charge stored on the capacity to be measured in the first charge state and an amount of charge stored on the capacity to be measured in the second charge state and to provide the digital output signal in dependence on the amount of charge received.

2. The capacity measuring circuit in accordance with claim 1, wherein the delta-sigma modulator comprises an integration capacity, and
wherein the delta-sigma modulator is configured to separate the second terminal of the capacity to be measured from the integration capacity in the first phase such that a charge on the integration capacity remains uninfluenced by a change in the charge stored on the capacity to be measured during the first phase; and
wherein the delta-sigma modulator is configured to couple the second terminal of the capacity to be measured to the integration capacity in the second phase such that, in the second phase, a charge on the integration capacity is influenced by a change, taking place during the second phase, of the charge stored on the capacity to be measured.

3. The capacity measuring circuit in accordance with claim 1, wherein the delta-sigma modulator is configured to pull the second terminal of the capacity to be measured to a predetermined constant potential, except for transition phases during which the second terminal of the capacity to be measured is in an electrically floating state.

4. The capacity measuring circuit in accordance with claim 1, wherein the measuring voltage source is configured to feed a frequency-stable and amplitude-stable sinusoidal voltage signal to the capacity to be measured during a capacity measurement.

5. The capacity measuring circuit in accordance with claim 4, wherein the measuring voltage source is configured to feed the frequency-stable and amplitude-stable sinusoidal voltage signal to the first terminal of the capacity to be measured in an uninterrupted manner for at least three periods.

6. The capacity measuring circuit in accordance with claim 1, wherein the capacity measuring circuit is configured to generate a periodic voltage course at the capacity to be measured such that voltage values at the capacity to be measured differ from voltage values of a sinusoidal voltage course during a period by at most 10% referenced to an amplitude of the sinusoidal voltage course.

7. The capacity measuring circuit in accordance with claim 1, wherein the delta-sigma modulator is configured to connect the second terminal of the capacity to be measured to a reference potential feed for a reference potential in a first phase and to connect the second terminal of the capacity to be measured to a virtual mass node pulled to the reference potential in a second phase and to detect a change in the charge stored on the capacity to be measured during the second phase.

8. The capacity measuring circuit in accordance with claim 1, wherein the capacity measuring circuit is configured such that the sinusoidal voltage signal provided by the measuring voltage source is synchronized with operating phases of the delta-sigma modulator.

9. The capacity measuring circuit in accordance with claim 8, wherein the delta-sigma modulator is configured to effect a transition between a first phase during which the second terminal of the capacity to be measured is separated from an integration capacity of the delta-sigma modulator, and a second phase during which the second terminal of the capacity to be measured is coupled to the integration capacity of the delta-sigma modulator, at the time of a maximum or a minimum of the sinusoidal voltage signal.

10. The capacity measuring circuit in accordance with claim 1, wherein the delta-sigma modulator comprises a charge integrator comprising an input-side charge summation node and an integration result output, wherein the charge integrator is configured to integrate a charge received at the input-side charge summation node so as to acquire the signal at the integration result output;
wherein the delta-sigma modulator additionally comprises a threshold value comparer configured to compare a level applied to the integration result output of the charge integrator, which describes an integral of the charge received at the charge summation node, to a threshold value and to provide a discrete value of the digital output signal depending on a result of the comparison; and
wherein the delta-sigma modulator is configured to receive a charge from the second terminal of the capacity to be measured at the charge summation node and to additionally feed an amount of charge depending on the result of the comparison to the charge summation node.

11. The capacity measuring circuit in accordance with claim 10, wherein the delta-sigma modulator is configured to feed a predetermined amount of charge which at least partly compensates an amount of charge received from the capacity to be measured to the charge summation node in a phase of the delta-sigma modulator.

12. The capacity measuring circuit in accordance with claim 11, wherein the delta-sigma modulator comprises an offset capacity comprising a first terminal and a second terminal, the delta-sigma modulator being configured to apply a sinusoidal voltage signal to the first terminal of the offset capacity and to cyclically couple and separate the second terminal of the offset capacity to and from the charge summation node, respectively.

13. The capacity measuring circuit in accordance with claim 12, wherein the delta-sigma modulator is configured to apply to the first terminal of the offset capacity a sinusoidal voltage signal which is opposite in phase compared to the sinusoidal voltage signal provided by the measuring voltage source; and
wherein the delta-sigma modulator is configured to connect the second terminal of the offset capacity and the second terminal of the capacity to be measured to the charge summation node during the same time intervals.

14. The capacity measuring circuit in accordance with claim 13, wherein the delta-sigma modulator is configured to connect the second terminal of the offset capacity and the second terminal of the capacity to be measured to the charge summation node via a common switch.

15. The capacity measuring circuit in accordance with claim 11, wherein the delta-sigma modulator is configured to feed at least a portion from a sinusoidal current course to the charge summation node.

16. The capacity measuring circuit in accordance with claim 10, wherein the delta-sigma modulator comprises a feedback charge providing circuit configured to feed an amount of charge depending on the result of the comparison to the charge summation node;
wherein the feedback charge providing circuit comprises at least a first feedback capacity;
wherein the feedback charge providing circuit is configured to apply a sinusoidal voltage signal to a first terminal of the first feedback capacity and to couple or separate a second terminal of the first feedback capacity to and from the charge summation node, respectively, in dependence on the result of the comparison.

17. The capacity measuring circuit in accordance with claim 16, wherein the feedback charge providing circuit comprises a second feedback capacity;
wherein the feedback charge providing circuit is configured to apply to a first terminal of the second feedback capacity a sinusoidal voltage signal which is opposite in phase compared to the sinusoidal voltage signal applied to the first terminal of the first feedback capacity, and
to couple, depending on the result of the comparison, either the second terminal of the first feedback capacity or a second terminal of the second feedback capacity to the charge summation node.

18. The capacity measuring circuit in accordance with claim 1, wherein the capacity measuring circuit is embodied in differential circuit technology.

19. A sensor system comprising:
a sensor capacity configured to change a capacity value by at least 20% in dependence on a quantity to be measured; and
a capacity measuring circuit comprising: a measuring voltage source configured to feed a sinusoidal voltage signal to a first terminal of a capacity to be measured so as to cause a temporal change in a charge stored on the capacity to be measured; and a delta-sigma modulator, the delta-sigma modulator being configured to receive a charge from a second terminal of the capacity to be measured and to provide a digital output signal which depends on a quantity of the charge received from the capacity to be measured; wherein the capacity measuring circuit is configured to bring the capacity to be measured to a first charge state in a first phase using the sinusoidal voltage signal and to bring the capacity to be measured to a second charge state in a second phase using the sinusoidal voltage signal; and wherein the delta-sigma modulator is configured to receive an amount of charge equaling a difference between an amount of charge stored on the capacity to be measured in the first charge state and an amount of charge stored on the capacity to be measured in the second charge state and to provide the digital output signal in dependence on the amount of charge received, wherein the capacity measuring circuit is coupled to the sensor capacity such that the sensor capacity represents the capacity to be measured.

20. The sensor system in accordance with claim 19, wherein the capacity measuring circuit is configured to effect, assuming the amplitude of the sinusoidal voltage signal provided by the measuring voltage source is known, an evaluation so as to acquire a piece of information describing a capacity value of the capacity to be measured.

21. The sensor system in accordance with claim 19, wherein the sensor capacity represents an input capacity of the delta-sigma modulator.

22. A method for determining a capacity value of a capacity to be measured, comprising:
feeding a sinusoidal voltage signal to a first terminal of the capacity to be measured;
receiving a charge from a second terminal of the capacity to be measured; and
proving a digital output signal such that the digital output signal is dependent on a quantity of the charge received from the capacity to be measured;
wherein the capacity to be measured is placed in a first charge state using the sinusoidal voltage signal in a first phase, and wherein the capacity to be measured is placed in a second charge state using the sinusoidal voltage signal in a second phase; and
wherein the digital output signal is provided using a delta-sigma modulation, in dependence on an amount of charge equaling a difference between an amount of charge stored on the capacity to be measured in the first charge state and an amount of charge stored on the capacity to be measured in the second charge state.

* * * * *